(12) United States Patent
Oh et al.

(10) Patent No.: US 12,394,340 B2
(45) Date of Patent: Aug. 19, 2025

(54) DISPLAY APPARATUS AND MANUFACTURING METHOD THEREOF

(71) Applicant: SAMSUNG ELECTRONICS CO., LTD., Suwon-si (KR)

(72) Inventors: Pilyong Oh, Suwon-si (KR); Kwangjae Lee, Suwon-si (KR); Seungjae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 17/903,611

(22) Filed: Sep. 6, 2022

(65) Prior Publication Data

US 2023/0177984 A1 Jun. 8, 2023

Related U.S. Application Data

(63) Continuation of application No. PCT/KR2022/012929, filed on Aug. 30, 2022.

(30) Foreign Application Priority Data

Dec. 3, 2021 (KR) ........................ 10-2021-0172791

(51) Int. Cl.
  *G09F 9/302* (2006.01)
  *G09F 9/33* (2006.01)
  *H01L 25/075* (2006.01)
(52) U.S. Cl.
  CPC .............. *G09F 9/3026* (2013.01); *G09F 9/33* (2013.01); *H01L 25/0753* (2013.01)

(58) Field of Classification Search
  None
  See application file for complete search history.

(56) References Cited

U.S. PATENT DOCUMENTS

| | | | |
|---|---|---|---|
| 9,414,503 | B2 | 8/2016 | Lee et al. |
| 9,560,775 | B2 | 1/2017 | Park et al. |
| 9,903,567 | B2 | 2/2018 | Lan et al. |
| 10,330,979 | B2 | 6/2019 | Ryu et al. |

(Continued)

FOREIGN PATENT DOCUMENTS

| | | |
|---|---|---|
| JP | 2005 338788 A | 12/2005 |
| JP | 2009 294272 A | 12/2009 |

(Continued)

OTHER PUBLICATIONS

Machine-generated English translation of KR 20200011087 (Year: 2020).*

(Continued)

*Primary Examiner* — Bo B Jang
(74) *Attorney, Agent, or Firm* — Sughrue Mion, PLLC

(57) ABSTRACT

A display apparatus includes a plurality of display modules, and a frame provided to support the plurality of display modules, the plurality of display modules being arranged in an M*N matrix on the frame, and the frame includes a frame panel including a first side and a second side opposite to the first side, the frame panel includes an insert portion passing through the frame panel and having a first opening being formed on the first side and a second opening being formed on the second side, and a size of a first opening being greater than a size of the second opening, and a stud provided in the insert portion.

16 Claims, 16 Drawing Sheets

(56) References Cited

U.S. PATENT DOCUMENTS

| | | | |
|---|---|---|---|
| 10,383,237 B2 | 8/2019 | Park et al. | |
| 11,282,911 B2 | 3/2022 | Horikoshi et al. | |
| 11,353,732 B2 | 6/2022 | Yoon et al. | |
| 2005/0264985 A1* | 12/2005 | Kim | H05K 5/02 |
| | | | 361/679.21 |
| 2013/0258717 A1 | 10/2013 | Hur et al. | |
| 2014/0355805 A1* | 12/2014 | Park | H04R 1/026 |
| | | | 361/752 |
| 2019/0115414 A1* | 4/2019 | Horikoshi | H10K 77/10 |
| 2020/0064677 A1* | 2/2020 | Yoon | H01R 13/6205 |
| 2020/0389987 A1 | 12/2020 | Kanno et al. | |

FOREIGN PATENT DOCUMENTS

| | | |
|---|---|---|
| JP | 2014 232323 A | 12/2014 |
| JP | 2017-506368 A | 3/2017 |
| JP | 6345380 B1 | 6/2018 |
| JP | 6822471 B2 | 1/2021 |
| KR | 10-0312784 B1 | 11/2001 |
| KR | 10-0682073 B1 | 2/2007 |
| KR | 10-2013-0109732 A | 10/2013 |
| KR | 10-2014-0141400 A | 12/2014 |
| KR | 10-2009663 B1 | 10/2019 |
| KR | 10-2050293 B1 | 11/2019 |
| KR | 10-2020-0011087 A | 2/2020 |
| KR | 10-2020-0023188 A | 3/2020 |
| KR | 10-2020-0073600 A | 6/2020 |
| KR | 10-2227615 B1 | 3/2021 |
| WO | 2020/138682 A1 | 7/2020 |

OTHER PUBLICATIONS

Search Report (PCT/ISA/220 and PCT/ISA/210), dated Dec. 13, 2022, issued by the International Searching Authority, Application No. PCT/KR2022/012929.

Written Opinion (PCT/ISA/237), dated Dec. 13, 2022, issued by the International Searching Authority, Application No. PCT/KR2022/012929.

European Extended Search Report issued Sep. 6, 2024 by the European Patent Office for EP Patent Application No. 22904397.1.

Communication dated Jan. 7, 2025 issued by the Japan Patent Office in Japanese Patent Application No. 2024-508299.

* cited by examiner

DISPLAY APPARATUS AND MANUFACTURING METHOD THEREOF

CROSS-REFERENCE TO RELATED APPLICATION(S)

This is a bypass continuation application of PCT/KR2022/012929 filed Aug. 30, 2022, which claims priority from Korean Patent Application No. 10-2021-0172791 filed Dec. 6, 2021, which disclosure is incorporated herein in its entirety.

BACKGROUND

1. Field

The disclosure relates to a display apparatus capable of displaying an image by combining modules in which a light emitting device is mounted on a substrate, and a manufacturing method thereof.

2. Related Art

A display apparatus is a type of an output device that visually displays data information such as characters and figures, and images.

In general, a display apparatus has mainly used a liquid crystal panel that requires a backlight or an organic light-emitting diode (OLED) panel provided with a film of an organic compound that emits light by itself in response to an electric current. However, the liquid crystal panel has difficulties such as a slow-response time, and high-power consumption, and further it is difficult to make the liquid crystal panel compact because the liquid crystal panel does not emit light by itself, and requires a backlight. In addition, because the OLED panel emits light by itself, the OLED panel does not require a backlight, and thus it is possible to make the OLED panel thin. However, the OLED panel is susceptible to screen burn-in. The screen burn-in is a phenomenon in which, if the same screen is displayed for a long time, the lifetime of the sub-pixels expires and the previous screen remains the same even when the screen is changed.

Accordingly, a micro light emitting diode (micro-LED or μLED) panel in which an inorganic light emitting device is mounted on a substrate and the inorganic light emitting device itself is used as a pixel has been studied as a new panel to replace the OLED panel.

A micro-light emitting diode display panel (hereinafter, micro-LED panel) is one of the flat display panels and is composed of a plurality of inorganic light emitting diodes (inorganic LEDs) that is 100 micrometers or less.

The micro-LED panel is also a self-light emitting device, but the micro-LED does not suffer from the screen burn-in and has excellent luminance, resolution, power consumption, and durability because of its inorganic nature.

In comparison with the LCD panel requiring a backlight, a micro-LED panel may offer better contrast, response times, and energy efficiency. Both organic light emitting diodes (OLEDs) and micro-LEDs corresponding to inorganic light emitting devices have good energy efficiency. However, the micro-LED has higher brightness and emission efficiency, and longer lifetime than the OLED.

In addition, by arraying the LEDs on a circuit board in pixel units, it is possible to manufacture a display module in a substrate unit, and it is easy to manufacture a display apparatus in various resolutions and screen sizes according to the customer's order.

SUMMARY

In accordance with an aspect of the disclosure, a display apparatus includes a plurality of display modules, and a frame provided to support the plurality of display modules, the plurality of display modules being arranged in an M*N matrix on the frame, and the frame includes a frame panel including a first side and a second side opposite to the first side, the frame panel includes an insert portion passing through the frame panel, a first opening being formed on the first side and a second opening being formed on the second side, and a size of the first opening being greater than a size of the second opening, and a stud provided in the insert portion.

The insert portion may be provided such that the first opening and the second opening form a step difference.

The insert portion may be formed in a shape that tapers from the first side toward the second side.

The stud may include a coupling portion having an opening toward the second opening, and the coupling portion may include a screw thread formed on an inner circumferential surface of the coupling portion.

The display apparatus may further include a bracket detachably coupled to the stud through the second opening, and the bracket may include at least one of a mounting bracket, a chassis bracket, a reinforcing bracket, and a board bracket.

The frame may further include a reinforcing member attached to the first side of the frame panel and provided to cover the first opening.

The plurality of display modules may be attached to the reinforcing member.

The frame panel may further include a first metal layer forming the first side of the frame panel, a second metal layer forming the second side of the frame panel, and a resin layer arranged between the first metal layer and the second metal layer.

A size of a portion of the insert portion formed in the resin layer may be a same as a size of another portion of the insert portion formed in the first metal layer.

Each of a surface formed on the first side and a surface formed on the second side may be flat.

In accordance with another aspect of the disclosure, a manufacturing method of a display apparatus includes providing a frame panel including a first side and a second side opposite to the first side, forming an insert portion to pass through the frame panel, the insertion portion including a first opening formed on the first side and a second opening formed on the second side, a size of the first opening being greater than a size of the second opening, inserting a stud into the insert portion through the first opening, and detachably coupling a bracket to the stud through the second opening.

The forming of the insert portion may include forming the insertion portion such that the first opening and the second opening form a step difference.

The forming of the insert portion may include forming the insert portion in a shape that tapers from the first side toward the second side.

The stud may include a coupling portion having an opening toward the second opening, and the coupling portion may include a screw thread formed on an inner circumferential surface of the coupling portion.

The manufacturing method may further include attaching a reinforcing member to the first side of the frame panel after inserting the stud into the insert portion.

The manufacturing method may further include forming a module opening on the frame panel and the reinforcing member after attaching the reinforcing member to the first side of the frame panel.

The manufacturing method may further include attaching a plurality of display modules to the reinforcing member after forming the module opening.

The bracket may include at least one of a mounting bracket, a chassis bracket, a reinforcing bracket, and a board bracket.

The forming of the insert portion may include forming the insert portion from the first side by using at least one of a shape processing apparatus, a water jet, and a laser.

Each of a surface formed on the first side and a surface formed on the second side may be flat.

DESCRIPTION

Figure 1:
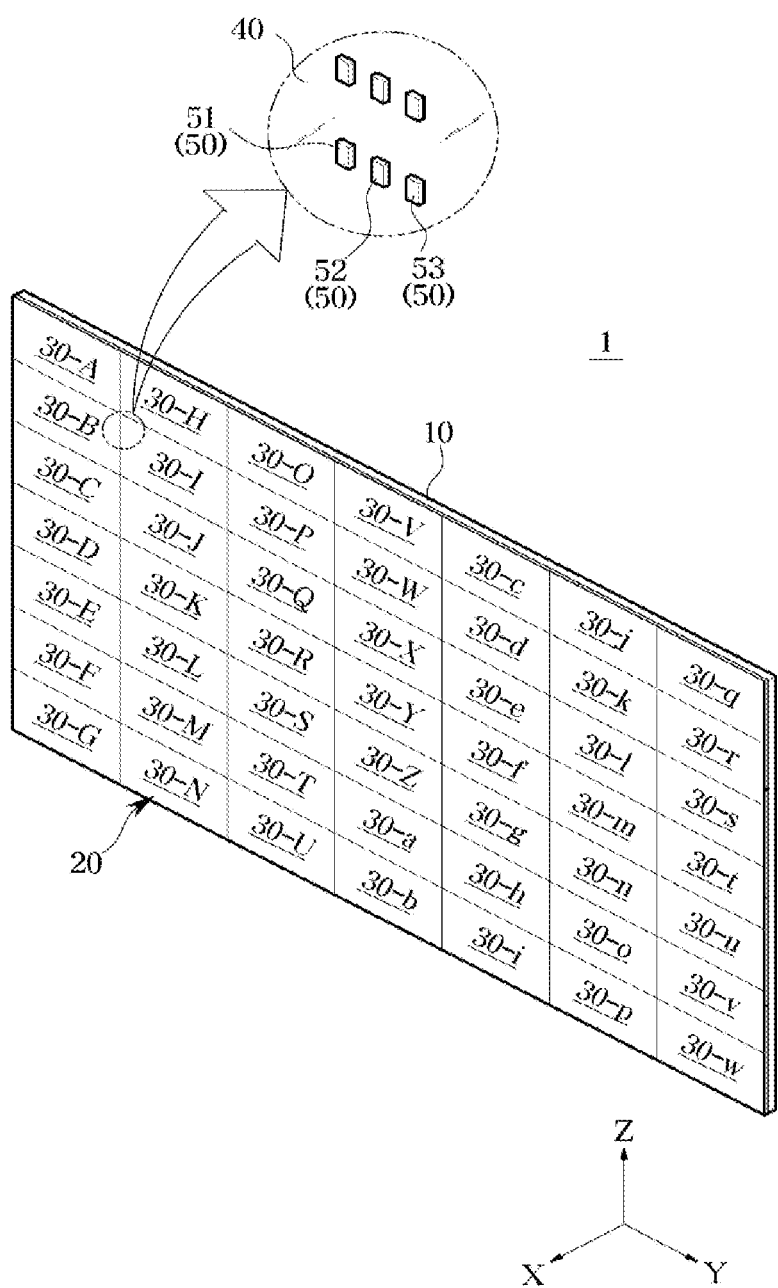
FIG. 1 is a view illustrating a display apparatus according to an embodiment of the disclosure.

Additional aspects of the disclosure will be set forth in part in the description which follows and, in part, will be obvious from the description, or may be learned by practice of the disclosure.

Embodiments described in the disclosure and configurations shown in the drawings are merely examples of the embodiments of the disclosure, and the scope of the disclosure should be understood to include various modifications or equivalents to replace the embodiments at the time of filing of the present application.

The singular forms "a," "an" and "the" are intended to include the plural forms as well, unless the context clearly indicates otherwise. The shapes and sizes of elements in the drawings may be exaggerated for the clear description.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

Also, in the present description, the meaning of "identical" includes things that are similar to each other in properties or are similar within a certain range. Also, "identical" means "substantially identical". It should be understood that "substantially identical" means that a value corresponding to differences within a negligible range with respect to a reference value or a numerical value corresponding to a manufacturing error range are included in the range of "identical".

Hereinafter, embodiments according to the disclosure will be described in detail with reference to the accompanying drawings.

Figure 2:
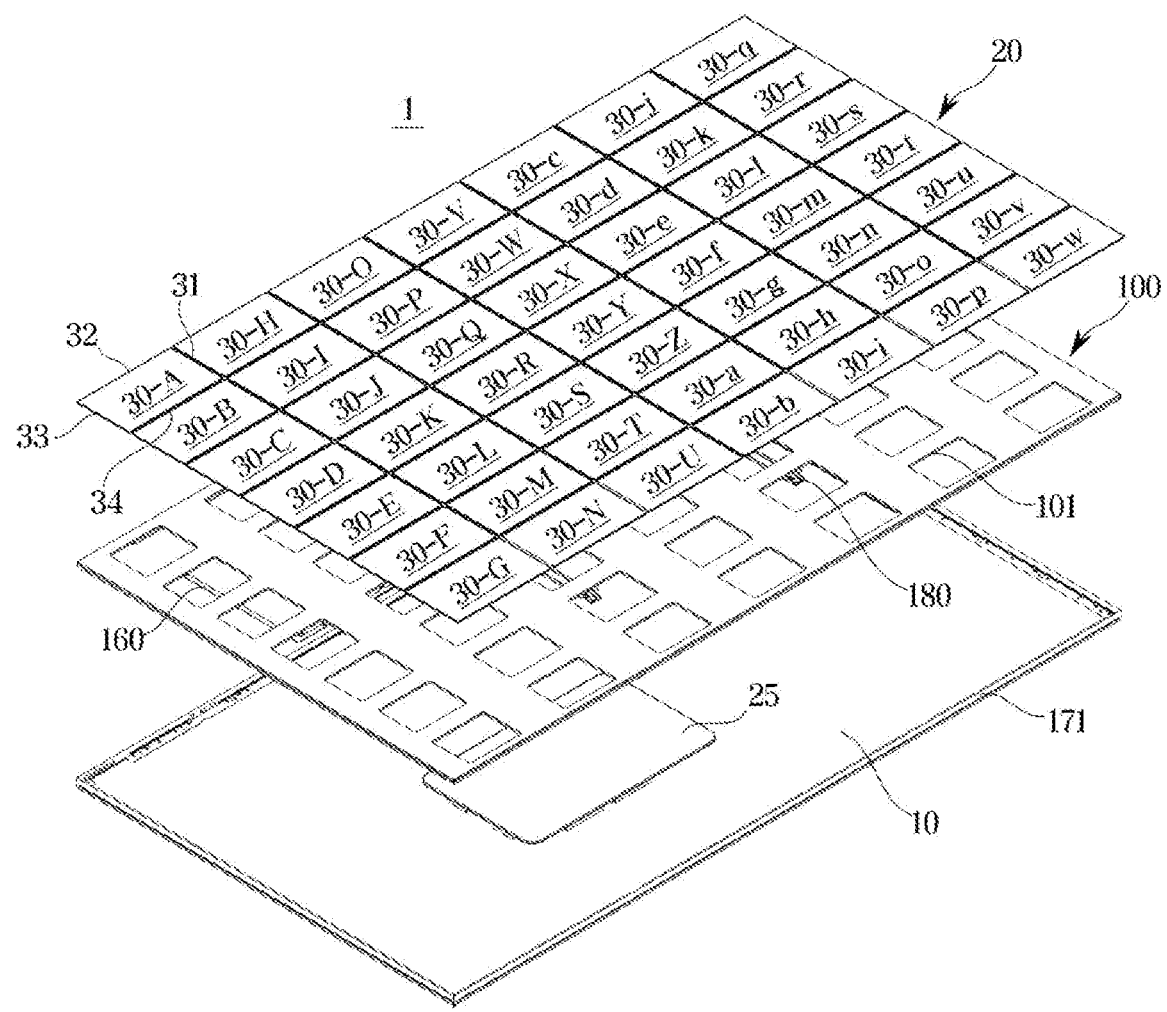
FIG. 2 is an exploded-view illustrating a main configuration of the display apparatus of FIG. 1.
Figure 3:
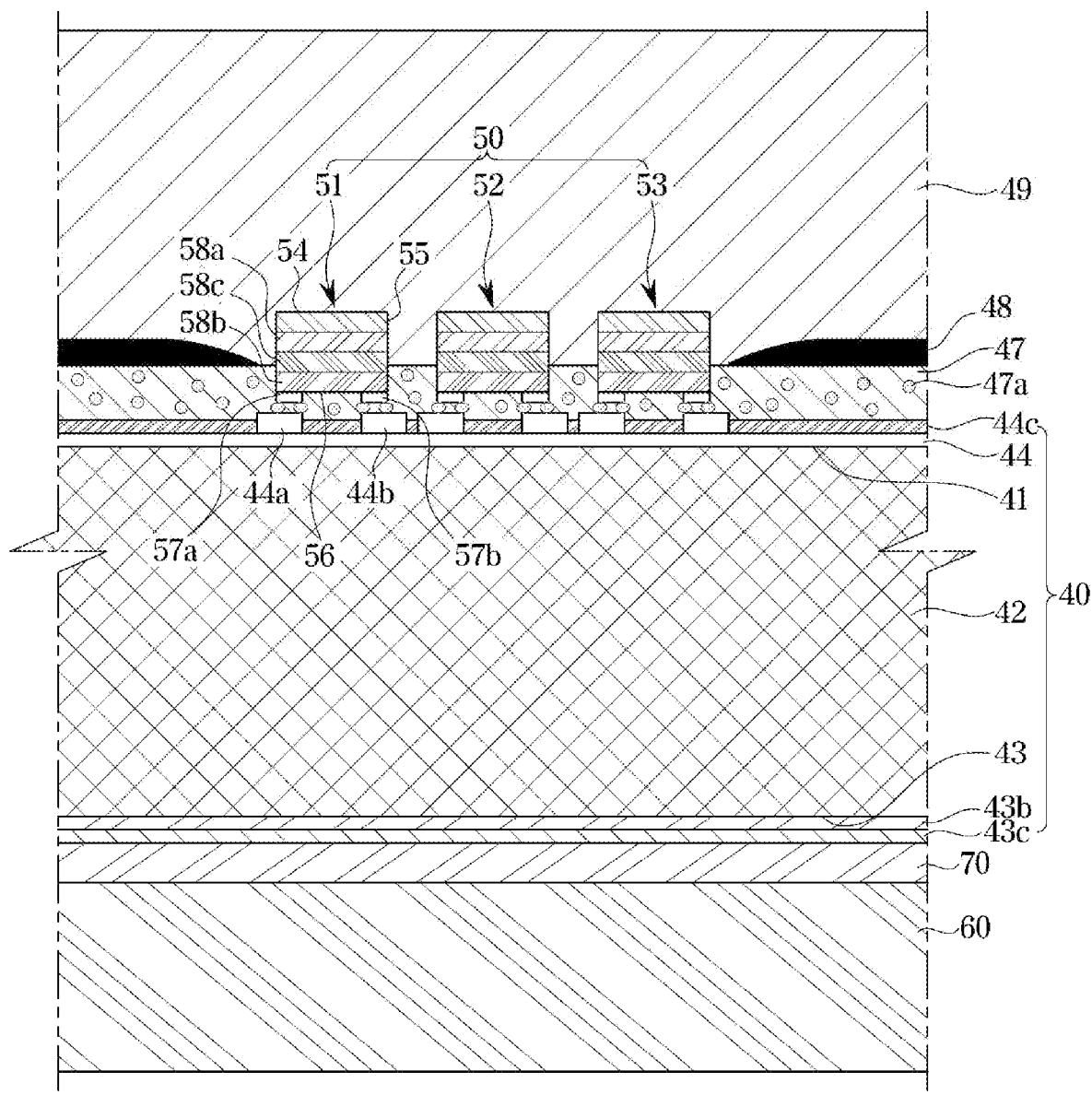
FIG. 3 is an enlarged cross-sectional view illustrating a part of one display module shown in FIG. 1.
Figure 4:
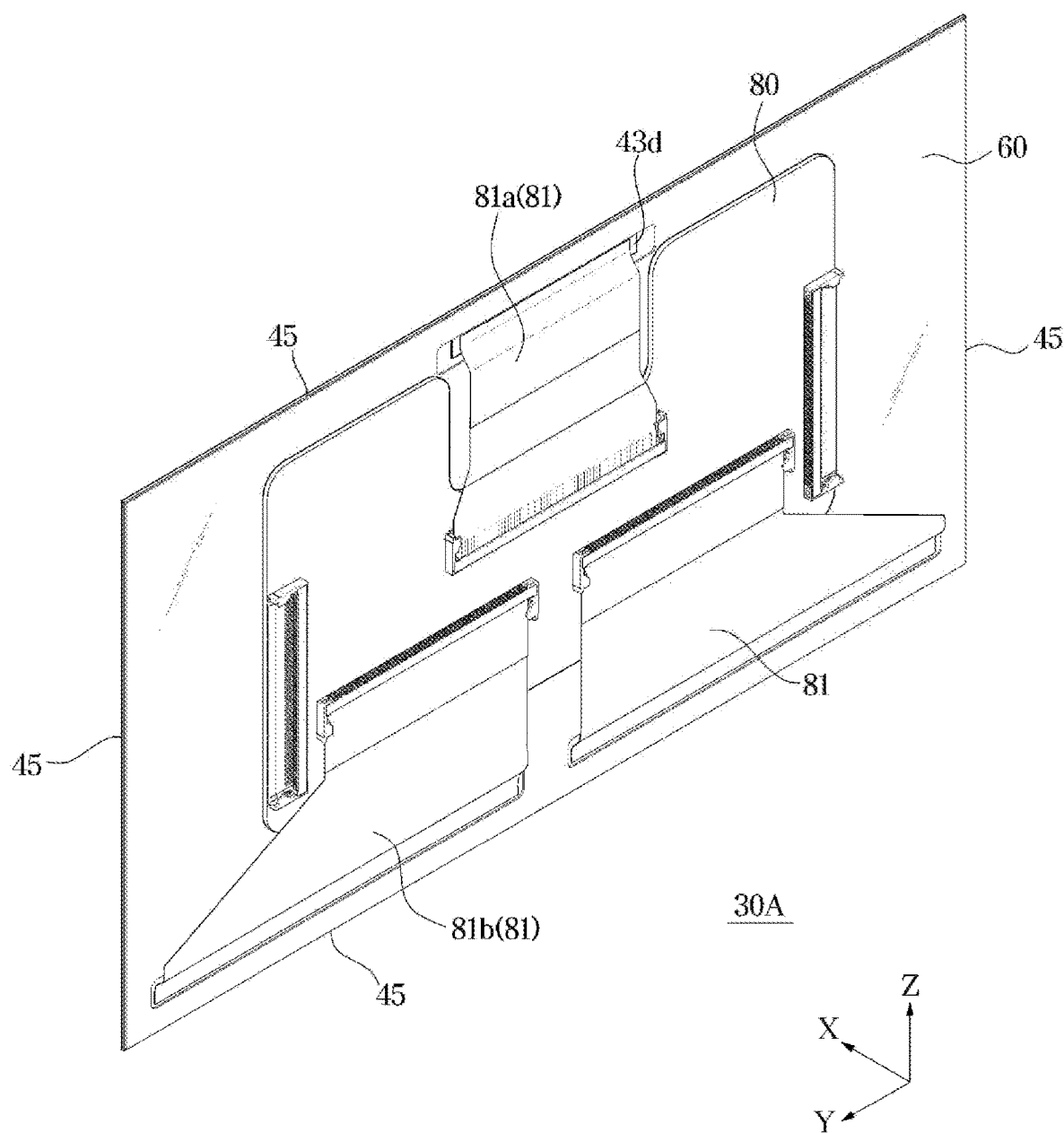
FIG. 4 is a rear view illustrating a display module of the display apparatus shown in FIG. 1.

FIG. 1 is a view illustrating a display apparatus according to an embodiment of the disclosure, FIG. 2 is an exploded-view illustrating a main configuration of the display apparatus of FIG. 1, FIG. 3 is an enlarged cross-sectional view illustrating a part of one display module shown in FIG. 1, and FIG. 4 is a rear view illustrating a display module of the display apparatus shown in FIG. 1.

A part of a configuration of a display apparatus 1 as well as a plurality of inorganic light emitting devices 50 illustrated in the drawings is a component in a micro-unit having a size of several μm to hundreds of μm, and for convenience of description, some components (the plurality of inorganic light emitting devices 50 and a black matrix 48, etc.) are exaggerated.

The display apparatus 1 is a device that displays information, material, data, etc. as characters, figures, graphs, images, etc. and a television, a personal computer, a mobile, and a digital signage may be implemented as the display apparatus 1.

According to an embodiment of the disclosure, as shown in FIGS. 1 and 2, the display apparatus 1 may include a display panel 20 provided to display an image, a power supply device (not shown) configured to supply power to the display panel 20, a main board 25 configured to control an overall operation of the display panel 20, a frame 100 provided to support the display panel 20, and a rear cover 10 provided to cover a rear surface of the frame 100.

The display panel 20 may include a plurality of display modules 30A-30w, a driver board (not shown) configured to drive each of the display modules 30A-30w, and a timing controller (T-con) board configured to generate a timing signal to control the each of the display modules 30A-30w.

The rear cover 10 may support the display panel 20. The rear cover 10 may be installed on the floor through a stand (not shown), or may be installed on a wall through a hanger (not shown).

The plurality of display modules 30A-30w may be arranged vertically and horizontally to be adjacent to each other. The plurality of display modules 30A-30w may be arranged in an M*N matrix. In the embodiment, 49 display modules 30A-30w are provided and arranged in a matrix of 7*7, but the number and the arrangement method of the plurality of display modules 30A-30w are not limited thereto.

The plurality of display modules 30A-30w may be installed in the frame 100. The plurality of display modules 30A-30w may be installed in the frame 100 through various known methods such as magnetic force using a magnet, a mechanical fitting structure, or an adhesion. The rear cover 10 may be coupled to the rear of the frame 100, and the rear cover 10 may form a rear exterior of the display apparatus 1.

The rear cover 10 may include a metal material. Accordingly, heat generated from the plurality of display modules 30A-30w and the frame 100 may be easily conducted to the rear cover 10 to increase the heat dissipation efficiency of the display apparatus 1.

As described above, the display apparatus 1 according to an embodiment of the disclosure may implement a large screen by tiling the plurality of display modules 30A-30w.

Unlike the embodiment of the disclosure, a single display module in the plurality of display modules 30A-30w may be applied to a display apparatus. That is, as a single unit, the display modules 30A-30w may be installed and applied in a wearable device, a portable device, a handheld device, an electronic product or an electronical component that requires a display. As described in an embodiment of the disclosure, the plurality of display modules 30A-30w may be assembled in a matrix type and then applied to a display apparatus such as a monitor for a personal computer (PC), a high-resolution TV, a signage, or an electronic display.

The plurality of display modules 30A-30w may include the same configuration. Accordingly, a description of any one display module described below may be equally applied to all other display modules.

Hereinafter, each of the plurality of display modules 30A-30w will be described with reference to a first display module 30A because all of the plurality of display modules 30A-30w are formed identically.

Among the plurality of display modules 30A-30w, the first display module 30A may be formed in a quadrangle type. Alternatively, the first display module 30A may be provided in a rectangular type or a square type.

Accordingly, the first display module 30A may include edges 31, 32, 33, and 34 formed in up, down, left and right directions with respect to a first direction X, which is the front.

As illustrated in FIG. 3, each of the plurality of display modules 30A-30w may include a substrate 40 and a plurality of inorganic light emitting devices 50 mounted on the substrate 40. The plurality of inorganic light emitting devices 50 may be mounted on a mounting surface 41 of the substrate 40 facing the first direction X. In FIG. 3, for convenience of description, a thickness of the substrate 40 in the first direction X is shown to be enlarged.

The substrate 40 may be formed in a quadrangle type. As described above, the each of the plurality of display modules 30A-30w may be provided in a quadrangle type, and thus the substrate 40 may be formed in a quadrangle type to correspond to the type of the display module.

Alternatively, the substrate 40 may be provided in a rectangle type or a square type.

Therefore, as for the first display module 30A, the substrate 40 may include 4 edges corresponding to the edges 31, 32, 33, and 34 of the first display module 30A formed in four directions of up, down, left and right with respect to the first direction X that is the front.

The substrate 40 may include a base substrate 42, the mounting surface 41 forming one surface of the base substrate 42, a rear surface 43 arranged on the opposite side to the mounting surface 41 and forming the other surface of the base substrate 42, and a side surface 45 arranged between the mounting surface 41 and the rear surface 43.

The substrate 40 may include a thin film transistor (TFT) layer 44 formed on the base substrate 42 to drive the inorganic light emitting devices 50. The base substrate 42 may include a glass substrate. That is, the substrate 40 may include a Chip on Glass (COG) type substrate. First and second pad electrodes 44a and 44b provided to electrically connect the inorganic light emitting devices 50 to the TFT layer 44 may be formed on the substrate 40.

A thin film transistor (TFT) forming the TFT layer 44 is not limited to a specific structure or type, and may be configured in various embodiments. That is, the TFT of the TFT layer 44 according to an embodiment of the disclosure may be implemented as an organic TFT and a graphene TFT as well as a Low Temperature Poly Silicon (LTPS) TFT, an oxide TFT, and a Si TFT such as a poly silicon, or a-silicon TFT.

Alternatively, based on the base substrate 42 of the substrate 40 being formed of a silicon wafer, the TFT layer 44 may be replaced with a complementary metal-oxide semiconductor (CMOS) transistor, n-type metal-oxide semiconductor field-effect-transistor (MOSFET) or p-type MOSFET transistor.

The plurality of inorganic light emitting devices 50 may be formed of an inorganic material, and may include inorganic light emitting devices having sizes of several μm to several tens of μm in width, length, and height, respectively. The micro-inorganic light emitting device may have a length of 100 μm or less on a short side among width, length, and height. That is, the inorganic light emitting device 50 may be picked up from a sapphire or silicon wafer and directly transferred onto the substrate 40. The plurality of inorganic light emitting devices 50 may be picked up and transported through an electrostatic method using an electrostatic head or a stamp method using an elastic polymer material such as Polydimethylsiloxane (PDMS) or silicon as a head.

The plurality of inorganic light emitting devices 50 may be a light emitting structure including an n-type semiconductor 58a, an active layer 58c, a p-type semiconductor 58b, a first contact electrode 57a, and a second contact electrode 57b.

Although not shown in the drawing, one of the first contact electrode 57a and the second contact electrode 57b may be electrically connected to the n-type semiconductor 58a, and the other of the first contact electrode 57a and the second contact electrode 57b may be electrically connected to the p-type semiconductor 58b.

The first contact electrode 57a and the second contact electrode 57b may be a flip chip type in which the first contact electrode 57a and the second contact electrode 57b are horizontally arranged to face the same direction (a direction opposite to an emission direction).

The inorganic light emitting device 50 may include a light emitting surface 54 arranged to face the first direction X, a side surface 55, and a bottom surface 56 arranged to be opposite to the light emitting surface 54, which are based on arrangement in which the inorganic light emitting device 50 is mounted on the mounting surface 41. The first contact electrode 57a and the second contact electrode 57b may be formed on the bottom surface 56.

That is, the first and second contact electrodes 57a and 57b of the inorganic light emitting device 50 may be arranged on the opposite side of the light emitting surface 54, and accordingly, the first and second contact electrodes 57a and 57b may be arranged on the opposite side to the direction in which light is emitted.

The first and second contact electrodes 57a and 57b may be arranged to face the mounting surface 41, and provided to be electrically connected to the TFT layer 44. The light emitting surface 54 emitting light may be arranged in a direction opposite to the direction in which the first and second contact electrodes 57a and 57b are arranged.

Therefore, in response to the light generated from the active layer 58c and emitted in the first direction X through the light emitting surface 54, the light may be emitted toward the first direction X without the interference of the first contact electrode 57a or the second contact electrode 57b.

That is, the first direction X may be defined as a direction in which the light emitting surface 54 is arranged to emit light.

The first contact electrode 57a and the second contact electrode 57b may be electrically connected to a first pad electrode 44a and a second pad electrode 44b, respectively, formed on the mounting surface 41 of the substrate 40.

The inorganic light emitting device 50 may be directly connected to the pad electrodes 44a and 44b through an anisotropic conductive layer 47 or a bonding structure such as solder.

The anisotropic conductive layer 47 may be formed on the substrate 40 to mediate electrical bonding between the contact electrodes 57a and 57b and the pad electrodes 44a and 44b. The anisotropic conductive layer 47 may include a structure in which an anisotropic conductive adhesive is attached on a protective film, and particularly, a structure in which conductive balls 47a are dispersed in an adhesive resin. The conductive ball 47a may be a conductive sphere surrounded by a thin insulating film, and may electrically connect conductors to each other as the insulating film is broken by pressure.

The anisotropic conductive layer 47 may include an anisotropic conductive film (ACF) in the form of a film and an anisotropic conductive paste (ACP) in the form of a paste.

Therefore, by a pressure applied to the anisotropic conductive layer 47 in a state in which the plurality of inorganic light emitting devices 50 are mounted on the substrate 40, the insulating film of the conductive balls 47a may be broken and thus the contact electrodes 57a and 57b of the inorganic light emitting device 50 may be electrically connected to the pad electrodes 44a and 44b of the substrate 40.

However, although not shown in the drawings, the plurality of inorganic light emitting devices 50 may be mounted on the substrate 40 through solder (not shown) instead of the anisotropic conductive layer 47. After the inorganic light emitting device 50 is aligned on the substrate 40, the inorganic light emitting device 50 may be bonded to the substrate 40 through a reflow process.

The plurality of inorganic light emitting devices 50 may include a red light emitting device 51, a green light emitting device 52, and a blue light emitting device 53. As for the inorganic light emitting device 50, a series of the red light emitting device 51, the green light emitting device 52, and the blue light emitting device 53 may be mounted on the mounting surface 41 of the substrate 40 as one unit. A series of the red light emitting device 51, the green light emitting device 52, and the blue light emitting device 53 may form a single pixel. In this case, the red light emitting device 51, the green light emitting device 52, and the blue light emitting device 53 may form a sub pixel, respectively.

The red light emitting device 51, the green light emitting device 52, and the blue light emitting device 53 may be arranged in a line at a predetermined interval according to the embodiment of the disclosure, and alternatively, arranged in other shapes such as a triangular shape.

The substrate 40 may include a light absorbing layer 44c provided to absorb external light to improve contrast. The light absorbing layer 44c may be formed on the entire mounting surface 41 of the substrate 40. The light absorbing layer 44c may be formed between the TFT layer 44 and the anisotropic conductive layer 47.

The plurality of display modules 30A-30w may further include a black matrix 48 formed between the plurality of inorganic light emitting devices 50.

The black matrix 48 may perform a function of supplementing the light absorbing layer 44c formed entirely on the mounting surface 41 of the substrate 40. That is, the black matrix 48 may absorb external light to allow the substrate 40 to appear black, thereby improving the contrast of the screen.

The black matrix 48 may have a black color.

According to the embodiment, the black matrix 48 may be arranged between pixels formed by a series of the red light emitting device 51, the green light emitting device 52, and the blue light emitting device 53. Unlike the embodiment, the black matrix 48 may be formed more precisely to partition each of the light emitting devices 51, 52, and 53 corresponding to the sub-pixel.

The black matrix 48 may be formed in a grid shape having a horizontal pattern and a vertical pattern to be arranged between pixels.

The black matrix 48 may be formed by applying a light-absorbing ink on the anisotropic conductive layer 47 and then curing the light-absorbing ink through an ink-jet process, or by coating a light-absorbing film on the anisotropic conductive layer 47.

That is, on the anisotropic conductive layer 47 formed on the entire mounting surface 41, the black matrix 48 may be arranged on a space, in which the plurality of inorganic light emitting devices 50 is not mounted, between the plurality of inorganic light emitting devices 50.

The plurality of display modules 30A-30w may include a front cover 49 arranged in the first direction X on the mounting surface 41 to cover the mounting surface 41 of the plurality of display modules 30A-30w.

The front cover 49 may be provided in plurality so as to be respectively formed in the first direction X on the plurality of display modules 30A-30w.

The front cover 49 may include a film (not shown).

The film (not shown) of the front cover 49 may be provided as a functional film having optical performance.

The front cover 49 may be provided to cover the substrate 40 to protect the substrate 40 from external force.

Typically, an adhesive layer (not shown) of the front cover 49 may be provided to have a predetermined height or more in the first direction X which the mounting surface 41 or the light emitting surface 54 faces. This is to sufficiently fill a gap that may be formed between the front cover 49 and the plurality of inorganic light emitting devices 50 in response to arranging the front cover 49 on the substrate 40.

Each of the plurality of display modules 30A-30w may include a heat dissipation member 60 provided on the rear surface 43 of the substrate 40 to dissipate heat generated from the substrate 40.

The heat generated from the substrate 40 may include heat generated in various components. Among various kinds of heat generated from the substrate 40 and transferred to the rear surface 43, heat that occupies the largest proportion is heat generated in response to emission of the plurality of inorganic light emitting devices 50. Further, heat may be generated in a plurality of components arranged on the mounting surface 41 of the substrate 40 such as the TFT layer 44, and then the heat may be transferred into the substrate 40.

In addition, heat may be transferred from the outside of the substrate 40 to the substrate 40, and heat may be transferred to the substrate 40 through components other than the substrate 40. Accordingly, heat may be generated in the substrate 40.

Heat, which is generated in the substrate 40, described below refers to heat that is generated in the plurality of components, including the plurality of inorganic light emitting devices 50, arranged on the substrate 40 and then transferred to the substrate 40.

Particularly, as described above, because the most heat generated from the plurality of inorganic light emitting devices 50 is transferred into the substrate 40, the largest proportion of the heat generated from the substrate 40 is heat generated from the plurality of inorganic light emitting devices 50. However, as described above, it may be described that heat is generated in the substrate 40 by various components other than the plurality of inorganic light emitting devices 50 and by heat generated outside the substrate 40. In addition, each of the plurality of display modules 30A-30w may include an adhesive tape 70 arranged between the rear surface 43 and the heat radiation member 60 to adhere the rear surface 43 of the substrate 40 and the heat radiation member 60.

The plurality of inorganic light emitting devices 50 may be electrically connected to a pixel driving wiring (not shown) formed on the mounting surface 41, and an upper wiring layer (not shown) extending through the side surface 45 of the substrate 40 and formed as the pixel driving wiring (not shown).

The upper wiring layer (not shown) may be electrically connected to a side wiring (not shown) formed on the side surface 45 of the substrate 40. The side wiring (not shown) may be provided in the form of a thin film.

The upper wiring layer (not shown) may be connected to the side wiring (not shown) by an upper connection pad (not shown) formed on the edge side of the substrate 40.

The side wiring (not shown) may extend along the side surface 45 of the substrate 40 and may be connected to a rear wiring layer 43b formed on the rear surface 43.

An insulating layer 43c covering the rear wiring layer 43b may be formed on the rear wiring layer 43b in a direction which the rear surface of the substrate 40 faces.

That is, the plurality of inorganic light emitting devices 50 may be sequentially and electrically connected to the upper wiring layer (not shown), the side wiring (not shown), and the rear wiring layer 43b.

Further, as shown in FIG. 4, the display module 30A may include a driver circuit board 80 provided to electrically control the plurality of inorganic light emitting devices 50 mounted on the mounting surface 41. The driver circuit board 80 may be formed of a printed circuit board. The driver circuit board 80 may be arranged on the rear surface 43 of the substrate 40 in the first direction X. The driver circuit board 80 may be arranged on the heat dissipation member 60 bonded to the rear surface 43 of the substrate 40.

The display module 30A may include a flexible film 81 connecting the driver circuit board 80 to the rear wiring layer 43b to allow the driver circuit board 80 to be electrically connected to the plurality of inorganic light emitting devices 50.

One end of the flexible film 81 may be connected to a rear connection pad 43d arranged on the rear surface 43 of the substrate 40 and electrically connected to the plurality of inorganic light emitting devices 50.

The rear connection pad 43d may be electrically connected to the rear wiring layer 43b. Accordingly, the rear connection pad 43d may electrically connect the rear wiring layer 43b to the flexible film 81.

Because the flexible film 81 is electrically connected to the rear connection pad 43d, the flexible film 81 may transmit power and an electrical signal from the driver circuit board 80 to the plurality of inorganic light emitting devices 50.

The flexible film 81 may be formed of a flexible flat cable (FFC) or a chip on film (COF).

The flexible film 81 may include a first flexible film 81a and a second flexible film 81b that are respectively arranged in the up and down directions with respect to the first direction X.

The first and second flexible films 81a and 81b are not limited thereto, and may be arranged in the left and right directions with respect to the first direction X, or may be arranged in at least two directions in the up, down, left, and right directions, respectively.

The second flexible films 81b may be provided in plurality. However, the disclosure is not limited thereto, and a single second flexible film 81b may be provided, and the first flexible films 81a may also be provided in plurality.

The first flexible film 81a may transmit a data signal from the driver circuit board 80 to the substrate 40. The first flexible film 81a may be formed of COF.

The second flexible film 81b may transmit power from the driver circuit board 80 to the substrate 40. The second flexible film 81b may be formed of FFC.

However, the disclosure is not limited thereto, and the first flexible film 81a may transmit power from the driver circuit board 80 to the substrate 40 and be formed of FFC, and the second flexible film 81b may transmit a data signal from the driver circuit board 80 to the substrate 40 and be formed of COF.

Although not shown in the drawings, the driver circuit board 80 may be electrically connected to the main board 25 (refer to FIG. 2). The main board 25 may be arranged on the rear side of the frame 100, and at the rear of the frame 100, the main board 25 may be connected to the driver circuit board 80 through a cable (not shown).

As described above, the heat dissipation member 60 may be provided to be in contact with the substrate 40. The heat dissipation member 60 and the substrate 40 may be bonded to each other by the adhesive tape 70 arranged between the rear surface 43 of the substrate 40 and the heat dissipation member 60.

The heat dissipation member 60 may be formed of a metal material having a high thermal conductivity or implemented with a component having a high thermal conductivity. For example, the heat dissipation member 60 may be formed of an aluminum material.

Heat generated by the plurality of inorganic light emitting devices 50 mounted to the substrate 40 and the TFT layer 44 may be transferred to the heat dissipation member 60 through the adhesive tape 70 along the rear surface 43 of the substrate 40.

Accordingly, heat generated by the substrate 40 may be easily transferred to the heat dissipation member 60 and it is possible to prevent a temperature of the substrate 40 from being greater than or equal to a predetermined temperature.

The plurality of display modules 30A-30w may be arranged in various positions in the form of an M*N matrix. Each of the display modules 30A-30w is provided to be individually movable. In this case, each of the display modules 30A-30w may include the heat dissipation member 60 to maintain a certain level of heat dissipation performance regardless of a position in which each of the display modules 30A-30w is arranged.

The plurality of display modules 30A-30w may be provided in the form of various M*N matrixes so as to form various-sized screen of the display apparatus 1. Accordingly, in comparison with the heat dissipation through a single heat dissipation member provided for the heat dissipation, each of the display modules 30A-30w according to an embodiment of the disclosure may include an independent heat dissipation member 60 so as to individually dissipate the heat, thereby improving the heat dissipation performance of the entire display apparatus 1.

Based on a single heat dissipation member being arranged inside the display apparatus 1, a part of the heat dissipation member may not be arranged at a position corresponding to a position where some display modules are arranged in the front and rear directions, and the heat dissipation member may be arranged at a position corresponding to a position where any display module is not arranged in the front and rear directions. Therefore, the heat dissipation efficiency of the display apparatus 1 may be reduced.

That is, regardless of the position of the display modules 30A-30w, the display modules 30A-30w may perform self-dissipation by the heat dissipation member 60 arranged on the display modules 30A-30w, and thus it is possible to improve the heat dissipation performance of the entire display apparatus 1.

The heat dissipation member 60 may be provided in a quadrangular shape substantially corresponding to the shape of the substrate 40.

An area of the substrate 40 may be at least equal to or greater than an area of the heat dissipation member 60. In response to the substrate 40 and the heat dissipation member 60 being arranged side by side in the first direction X, the four edges of the substrate 40 having a rectangular shape may be formed to correspond to the four edges of the heat dissipation member 60 with respect to the center of the substrate 40 and the heat dissipation member 60, or the four edges of the substrate 40 having a rectangular shape may be formed to be arranged on the outer side than the four edges of the heat dissipation member 60 with respect to the center of the substrate 40 and the heat dissipation member 60.

The four edges of the substrate 40 may be provided to be arranged outside the four edges of the heat dissipation member 60. That is, the area of the substrate 40 may be provided to be greater than the area of the heat dissipation member 60.

The substrate 40 and the heat dissipation member 60 may be thermally expanded by heat transferred to each of the display modules 30A-30w. Because the heat dissipation member 60 has a higher coefficient of thermal expansion than the substrate 40, a value at which the heat dissipation member 60 is expanded is greater than a value at which the substrate 40 is expanded.

In this case, in response to the four edges of the substrate 40 being formed to correspond to the four edges of the heat dissipation member 60 or being arranged on the inner side than the four edges of the heat dissipation member 60, the edge of the heat dissipation member 60 may protrude to the outside of the substrate 40.

Accordingly, a separation distance between gaps formed between the respective display modules 30A-30w may be irregularly formed by the thermal expansion of the heat dissipation member 60 of each of the display modules 30A-30w. Therefore, some of seams may be easily recognized and thus the integrity of the screen of the display panel 20 may be reduced.

However, even when the substrate 40 and the heat dissipation member 60 are thermally expanded, the heat dissipation member 60 may not protrude to the outside of the four edges of the substrate 40 because the four edges of the substrate 40 are arranged outside the four edges of the heat dissipation member 60. Accordingly, the separation distance of the gap formed between the display modules 30A-30w may be constantly maintained.

According to an embodiment of the disclosure, the area of the substrate 40 may be provided to substantially correspond to the area of the heat dissipation member 60. Accordingly, heat generated from the substrate 40 may be evenly dissipated in the entire region of the substrate 40 without being isolated to a partial region of the substrate 40.

The heat dissipation member 60 may be bonded to the rear surface 43 of the substrate 40 by the adhesive tape 70.

The adhesive tape 70 may be provided in a size corresponding to that of the heat dissipation member 60. That is, the area of the adhesive tape 70 may be provided to correspond to the area of the heat dissipation member 60. The heat dissipation member 60 may be provided in a substantially quadrangular shape, and the adhesive tape 70 may be provided in a quadrangular shape to correspond to the shape of the heat dissipation member 60.

The edge of the heat dissipation member 60 and the edge of the adhesive tape 70 in the rectangular shape may be formed to correspond to each other with respect to the center of the heat dissipation member 60 and the adhesive tape 70.

Accordingly, the heat dissipation member 60 and the adhesive tape 70 may be easily manufactured in a single coupling configuration, and thus it is possible to increase the manufacturing efficiency of the entire display apparatus 1.

That is, in response to the heat dissipation member 60 being cut from one plate into a unit number, the adhesive tape 70 may be pre-bonded to one plate before the heat dissipation member 60 is cut, and thus the adhesive tape 70 and the heat dissipation member 60 may be simultaneously cut into a unit number, thereby reducing the process.

Heat generated by the substrate 40 may be transferred to the heat dissipation member 60 through the adhesive tape 70. Accordingly, the adhesive tape 70 may be provided to bond the heat dissipation member 60 to the substrate 40 while transferring the heat generated by the substrate 40 to the heat dissipation member 60.

Accordingly, the adhesive tape 70 may include a material having high heat dissipation performance.

The adhesive tape 70 may include a material having an adhesive property to bond the substrate 40 and the heat dissipation member 60.

The adhesive tape 70 may include a material having higher heat dissipation performance than a material having general adhesive property. Accordingly, the adhesive tape 70 may efficiently transfer heat from between the substrate 40 and the heat dissipation member 60 to each component.

In addition, the material having the adhesive property of the adhesive tape 70 may be formed of a material having higher heat dissipation performance than the adhesive material forming the general adhesive.

A material having higher heat dissipation performance means a material that effectively transfers heat with high thermal conductivity, high heat transfer, and low specific heat.

For example, the adhesive tape 70 may include a graphite material. However, the disclosure is not limited thereto, and the adhesive tape 70 may be generally formed of a material having the high heat dissipation performance.

Flexibility of the adhesive tape 70 may be greater than that of the substrate 40 and that of the heat dissipation member 60. Accordingly, the adhesive tape 70 may be formed of a material having high flexibility while having an adhesive property and heat dissipation property. The adhesive tape 70 may be formed of an inorganic double-sided tape. As described above, the adhesive tape 70 is formed of an inorganic double-sided tape and thus the adhesive tape 70 may be provided as a single layer in which a base material, which supports one surface bonded to the substrate 40 and the other surface bonded to the heat dissipation member 60, is not provided between the one surface and the other surface.

Because the adhesive tape 70 does not include the base material, the adhesive tape 70 may not include a material that interferes with the heat conduction, thereby increasing the heat dissipation performance. However, the adhesive tape 70 is not limited to the inorganic double-sided tape, and may be provided as a heat-dissipating tape having better heat dissipation performance than a general double-sided tape.

Because the substrate 40 is formed of a glass material and the heat dissipation member 60 is formed of a metal material, the material property of the glass material and the material property of the metal material may be different from each other and thus a degree of deformation of the material by the same heat may be different. That is, in response to heat generated in the substrate 40, the substrate 40 and the heat dissipation member 60 may be thermally expanded to different sizes due to the heat. Accordingly, the display module 30A may be damaged.

The substrate 40 and the heat dissipation member 60 have different expansion values at the same temperature, and thus in response to the substrate 40 and the heat dissipation member 60 expanded to different sizes in a state in which the substrate 40 and the heat dissipation member 60 are fixed to each other, stress may be generated in the substrate 40 and the heat dissipation member 60.

As for the material property, each material of the substrate 40 and the heat dissipation member 60 has a different coefficient of thermal expansion and thus there is difference in the physical deformation of the material caused by the heat. Particularly, a coefficient of thermal expansion of the metal material is greater than a coefficient of thermal expansion of the glass, and thus in response to the same heat applied to the substrate 40 and the heat dissipation member 60, the heat dissipation member 60 may be expanded and deformed more than the substrate 40.

Conversely, in response to the substrate 40 and the heat dissipation member 60 being cooled after the heat generation in the substrate 40 is terminated, the heat dissipation member 60 may be contracted and deformed more than the substrate 40.

The substrate 40 and the heat dissipation member 60 are in a state of being bonded to each other by the adhesive tape 70, and thus in response to the heat dissipation member 60 being deformed more than the substrate 40, an external force may be transmitted to the substrate 40.

Conversely, an external force may be transmitted to the heat dissipation member 60 by the substrate 40, but the substrate 40 may be damaged because the rigidity of the glass substrate 40 is less than the rigidity of the metal heat dissipation member 60.

The adhesive tape 70 may be arranged between the substrate 40 and the heat dissipation member 60 to absorb external force that is transmitted from different components while the substrate 40 and the heat dissipation member 60 are expanded to different sizes.

Accordingly, it is possible to prevent the external force from being transmitted to the substrate 40 and the heat dissipation member 60, and further to prevent the substrate 40 from being damaged.

The adhesive tape 70 may be formed of a material with high flexibility so as to absorb the external force transmitted from the substrate 40 and the heat dissipation member 60. Particularly, the flexibility of the adhesive tape 70 may be greater than that of the substrate 40 and that of the heat dissipation member 60.

Accordingly, in response to the external force, which is generated by the size change of the substrate 40 and the heat dissipation member 60, being transmitted to the adhesive tape 70, the adhesive tape 70 itself may be deformed and thus the adhesive tape 70 may prevent the external force from being transmitted to different components.

The adhesive tape 70 may have a predetermined thickness in the first direction X. In response to the thermal expansion of the heat dissipation member 60 by the heat or the contraction of the heat dissipation member 60 by the cooling, the heat dissipation member 60 may be expanded or contracted in a direction perpendicular to the first direction X, as well as the first direction X and thus the external force may be transmitted to the substrate 40.

The display panel 20 may display a screen by the plurality of display modules 30A-30w. In this case, the integrity of the screen may be deteriorated by a seam formed by a gap formed between the plurality of display modules 30A-30w.

Accordingly, in order to minimize the recognition of the seam of the display panel 20, the plurality of display modules 30A-30w may be arranged on the frame 100 to form regular gaps. This is because, when gaps are irregularly formed by the plurality of display modules 30A-30w, the recognition of the seam may be increased by some of the irregular gaps.

In a conventional display apparatus, a frame provided to support the display panel is formed of a metal material. A plurality of display modules may be tiled on a metal frame.

The substrate forming the plurality of display modules 30A-30w may be thermally expanded by heat generated from the display panel while the display apparatus is driven. As described above, because the plurality of display modules 30A-30w are supported by the frame formed of a metal material, a gap may be irregularly formed between the plurality of display modules 30A-30w due to the thermal expansion of the substrate and the thermal expansion of the frame. Accordingly, the recognition of the seam may be increased.

That is, because all of the substrate of the plurality of display modules 30A-30w is formed of a glass material, the substrate may be thermally expanded to a certain value. However, due to the thermal expansion of the metal frame supporting the substrate, a width between gaps may be irregular among the gaps between the plurality of display modules 30A-30w. This is because a material property of the metal material is different from that of the glass material.

The material property of the material may have different values depending on the coefficient of thermal expansion, specific heat, and thermal conductivity. Particularly, a degree of thermal expansion between the substrate and the frame may be different due to a difference between the coefficient of thermal expansion of the metal material and the coefficient of thermal expansion of the glass.

Due to the thermal expansion of the frame to which the plurality of display modules 30A-30w is bonded, in addition to the thermal expansion of the substrate of the plurality of display modules 30A-30w, a separation distance of the gaps between the plurality of display modules 30A-30w may change irregularly.

As described above, in order to prevent the irregular gap between the plurality of display modules 30A-30w caused by the thermal expansion of the frame of the metal material on which the plurality of display modules 30A-30w is arrayed, the frame 100 of the display apparatus 1 according to an embodiment of the disclosure may allow the plurality of display modules 30A-30w to be adhered thereto, and be formed of a material having a material property that is similar to a material property of the substrate 40 of the plurality of display modules 30A-30w.

That is, the frame 100 may be provided to have the material property similar to that of the substrate 40 in order to maintain a constant distance between the gaps formed between the respective display modules 30A-30w.

That the frame 100 is formed of a material having a material property similar to that of the above-described substrate 40 may include a meaning that the coefficient of thermal expansion, specific heat, and thermal conductivity of the frame 100 are similar to those of the substrate 40. Particularly, according to an embodiment of the disclosure, it may be understood that the coefficient of thermal expansion of the substrate 40 corresponds to the coefficient of thermal expansion of the frame 100.

The entire frame 100 may be formed of a material similar to the material property of the substrate 40 or may be formed of a material having a similar coefficient of thermal expansion. The frame 100 may be formed of a material having the same value as the coefficient of thermal expansion of the substrate 40.

However, the disclosure is not limited thereto, and thus the frame 100 may include a front layer (not shown) formed of a material having a material property corresponding to the material property of the substrate 40.

In response to the same heat transferred to the substrate 40 and the front layer (not shown) in a second direction Y or a third direction Z perpendicular to the first direction X in a state in which the substrate 40 is adhered to the front layer (not shown) in the first direction X, the substrate 40 and the front layer (not shown) may be expanded to a length corresponding to each other.

That is, in a state in which the entire frame 100 is formed of a material having a material property corresponding to the substrate 40, or only the front layer (not shown) forming the front surface of the frame 100 is formed of a material having a material property corresponding to the substrate 40, the front surface, to which the substrate 40 of the plurality of display modules 30A-30w is adhered, may be thermally expanded to the same value as the substrate 40 in response to the thermal expansion of the substrate 40 due to heat that is generated during the operation of the display apparatus 1.

Because the front surface of the frame 100 corresponding to the base surface, to which the plurality of display modules 30A-30w is adhered, is thermally expanded to the same value as the substrate 40 of the plurality of display modules 30A-30w, the same distance of gap formed between the plurality of display modules 30A-30w may be maintained.

Accordingly, the distance of the gap formed between the plurality of display modules 30A-30w after the thermal expansion of the substrate 40 may be maintained at the same as the distance of the gap before the thermal expansion of the substrate 40. Therefore, it is possible to maintain a predetermined level of seam and to maintain the integrity of the screen.

Therefore, even when the heat generated according to the driving of the display apparatus 1 is applied to the substrate 40 of the plurality of display modules 30A-30w, the distance of the gaps between the plurality of display modules 30A-30w may be constant, and thus it is possible to prevent a phenomenon in which some of the seams are increased and the integrity of the screen is deteriorated.

The frame 100 may be provided to support the display panel 20 and to have a rigidity greater than or equal to a predetermined level. Accordingly, the frame 100 may be formed of a metal material having a rigidity greater than or equal to a predetermined level, and the front surface of the frame 100 may be formed of a glass material corresponding to the substrate 40. However, the disclosure is not limited thereto, and the frame 100 may be formed of a material having a value different from the coefficient of thermal expansion of the substrate 40.

Hereinafter, the frame 100 according to an embodiment of the disclosure will be described in detail.

Figure 5:
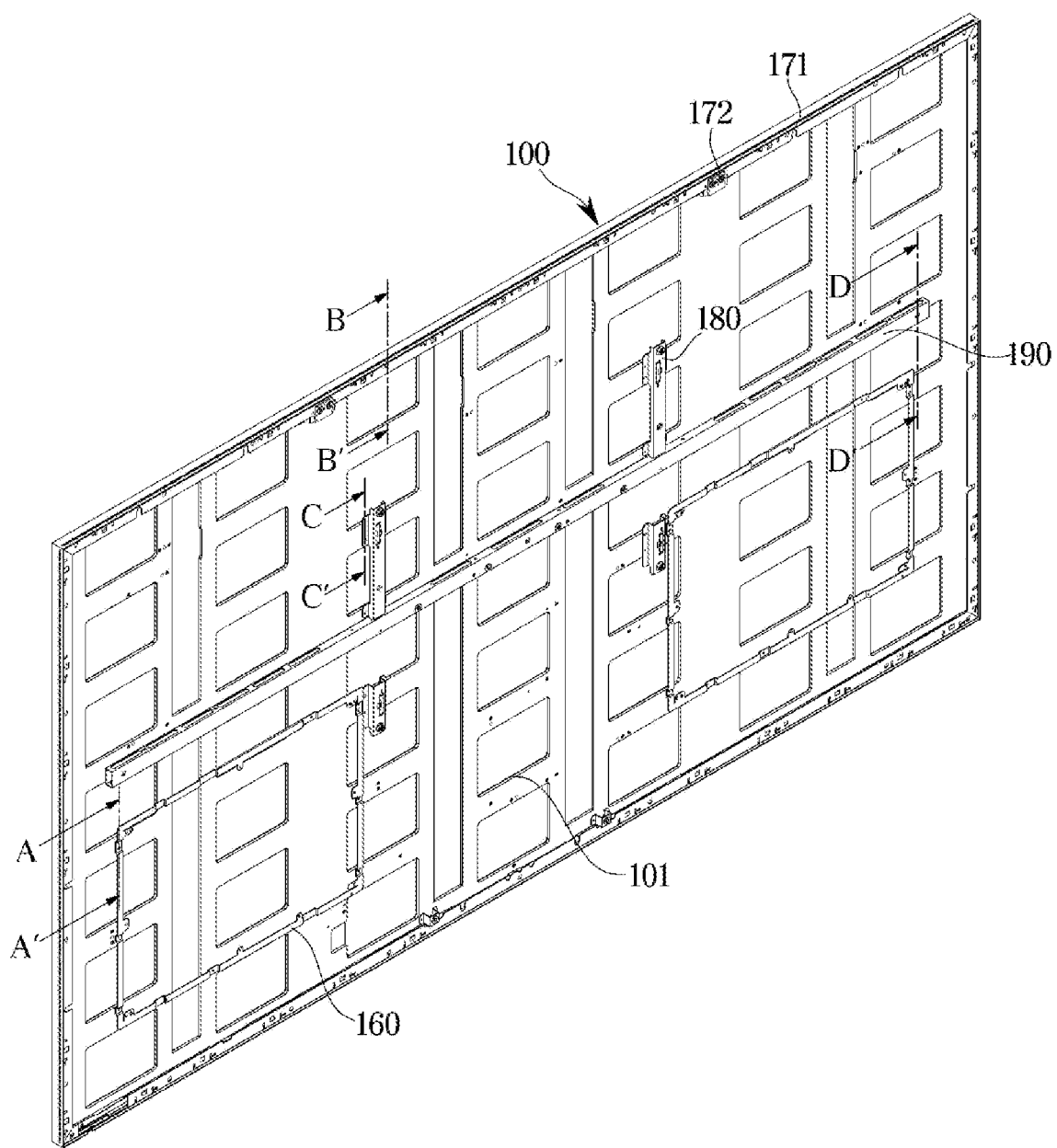
FIG. 5 is a view illustrating a frame and a bracket coupled to a rear side of the frame shown in FIG. 2.
Figure 6:
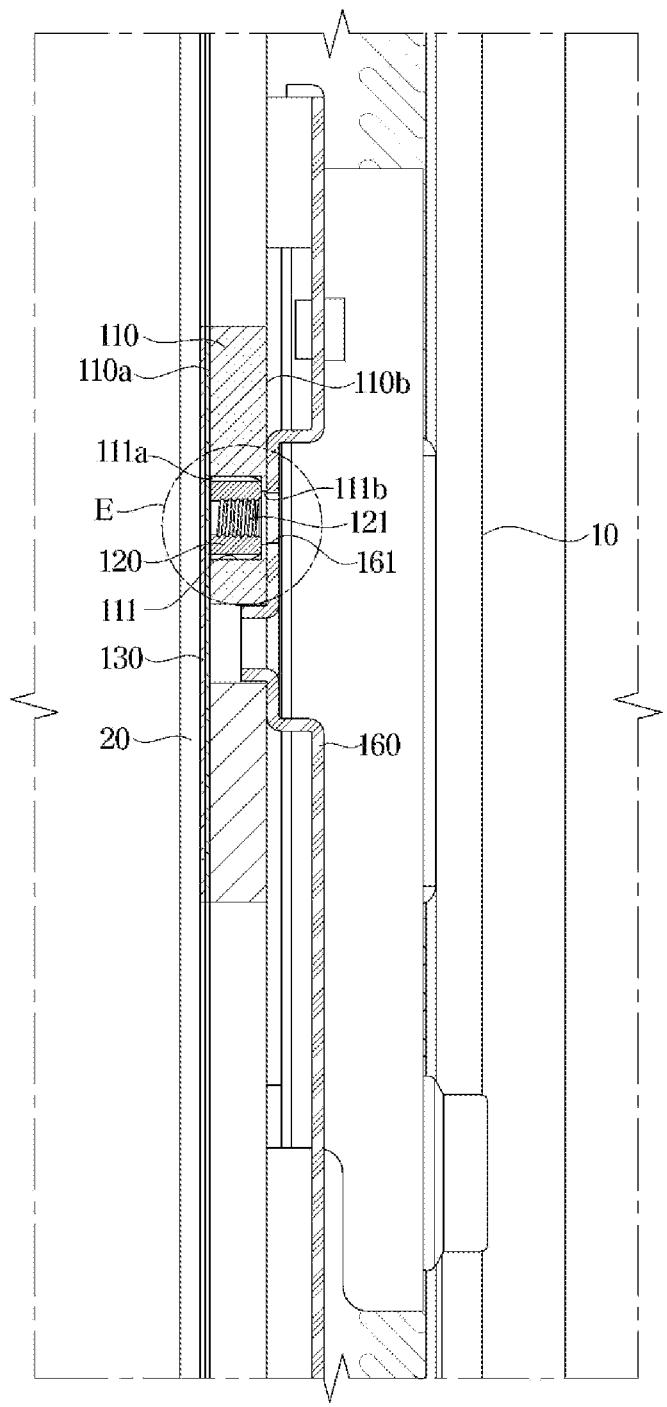
FIG. 6 is a cross-sectional view taken along line A-A' of FIG. 5.
Figure 7:
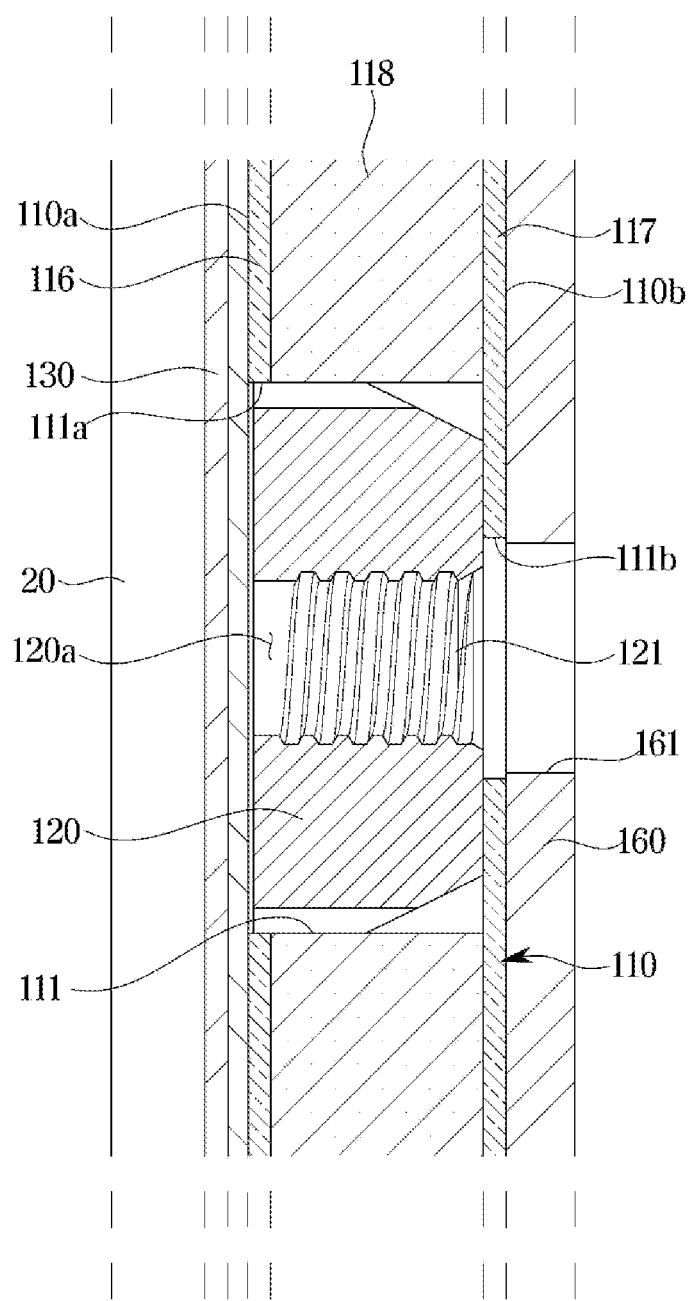
FIG. 7 is an enlarged view illustrating a part E of FIG. 6.
Figure 8:
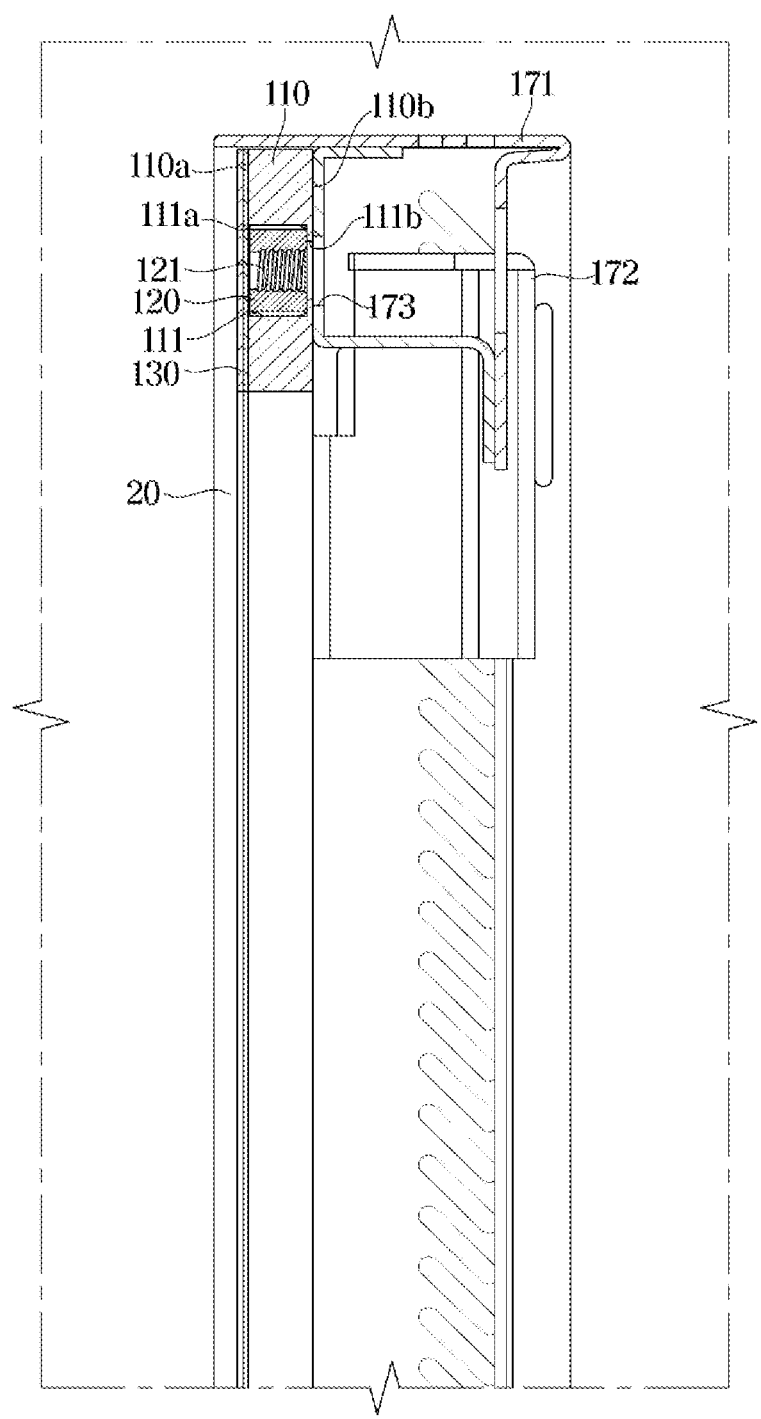
FIG. 8 is a cross-sectional view taken along line B-B' of FIG. 5.
Figure 9:
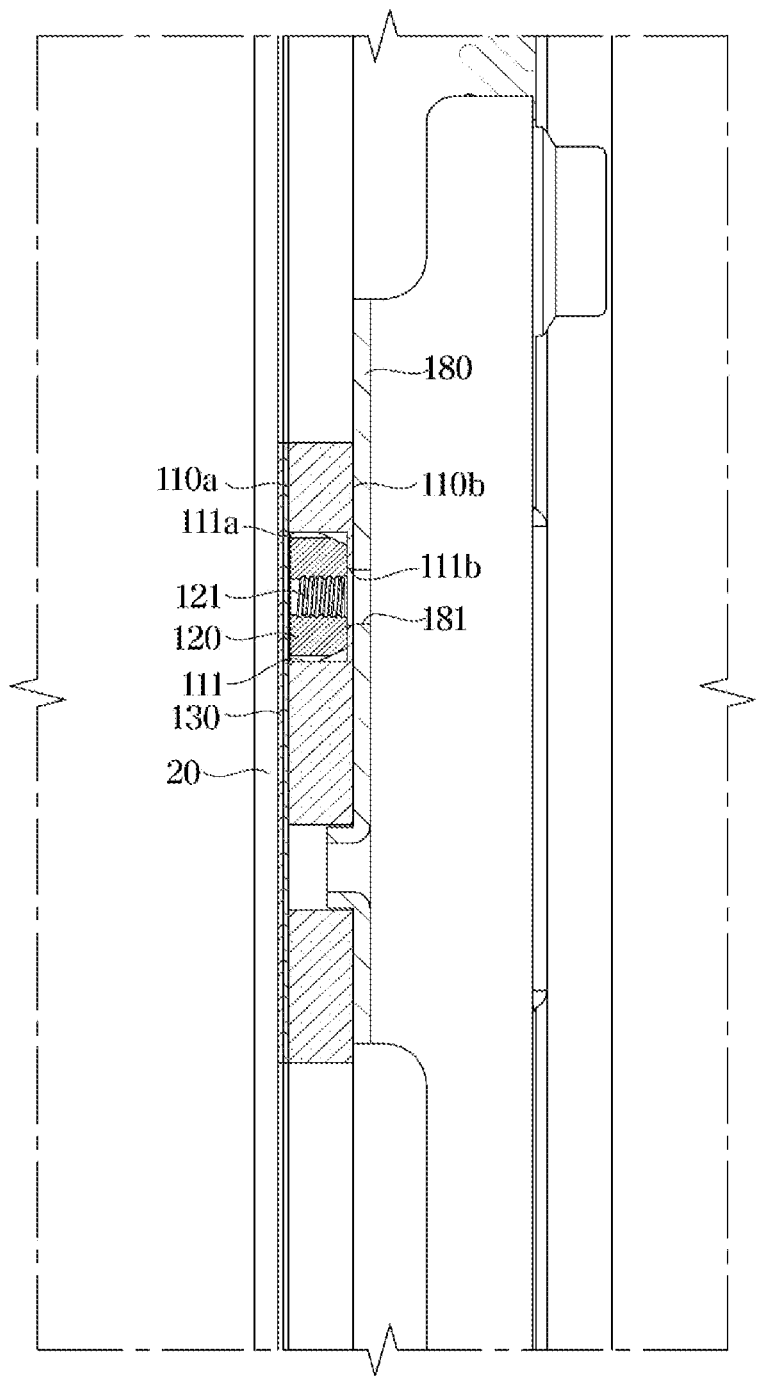
FIG. 9 is a cross-sectional view taken along line C-C' of FIG. 5.
Figure 10:
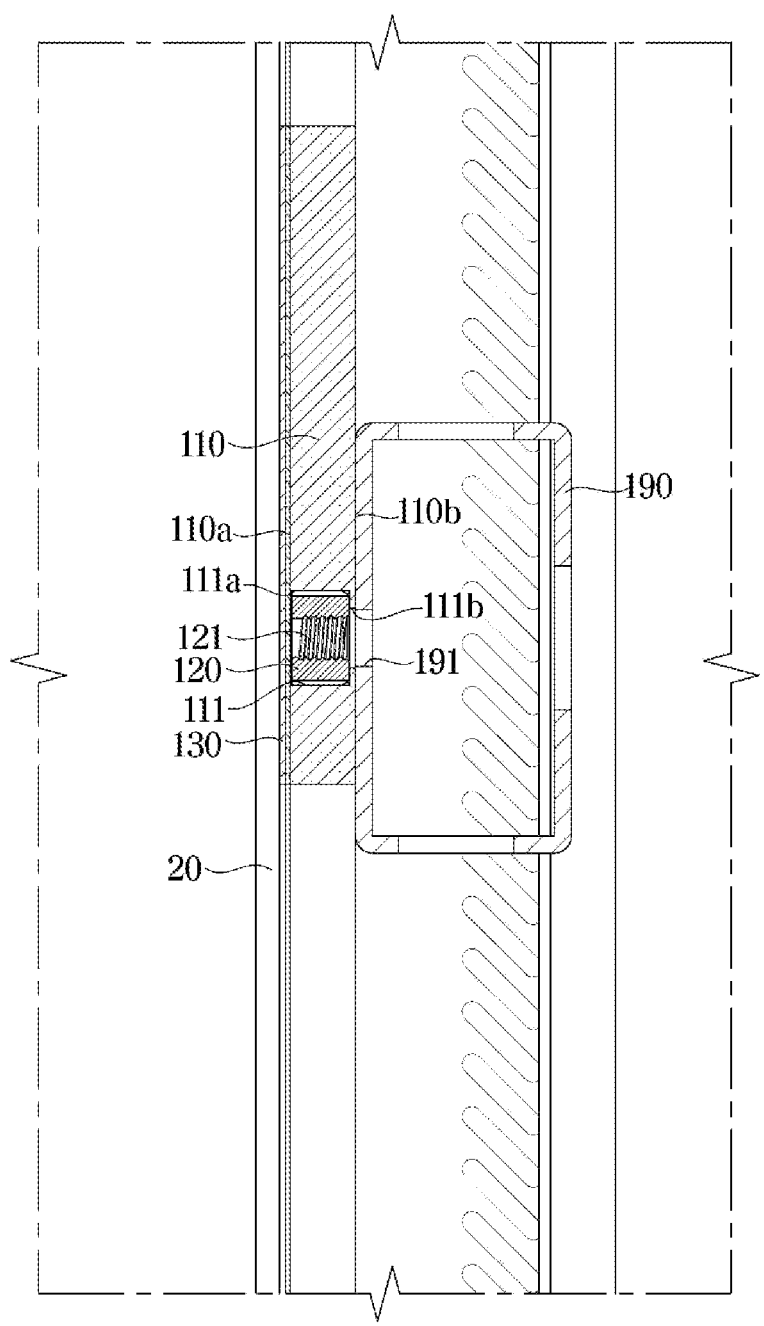
FIG. 10 is a cross-sectional view taken along line D-D' of FIG. 5.

FIG. 5 is a view illustrating a frame and brackets coupled to a rear side of the frame shown in FIG. 2. FIG. 6 is a cross-sectional view taken along line A-A' of FIG. 5. FIG. 7 is an enlarged view illustrating a part E of FIG. 6. FIG. 8 is a cross-sectional view taken along line B-B' of FIG. 5. FIG. 9 is a cross-sectional view taken along line C-C' of FIG. 5. FIG. 10 is a cross-sectional view taken along line D-D' of FIG. 5.

Referring to FIGS. 5 to 10, the frame 100 according to an embodiment of the disclosure may include a frame panel 110. The frame panel 110 may include a first side 110a facing the plurality of display modules 30A-30w and a second side 110b opposite to the first side 110a. The first side 110a may face forward, and the second side 110b may face rearward.

Referring to FIGS. 6 and 7, the frame panel 110 may include an insert portion 111 formed to pass through the frame panel 110 in the front and rear directions. The insert portion 111 may be provided to allow a stud 120 to be inserted into the insert portion 111. The insert portion 111 may be provided in a position and number corresponding to brackets 160, 172, 180, and 190 to be coupled to the frame 100.

A first opening 111a may be formed in the first side 110a of the frame panel 110. A second opening 111b may be formed in the second side 110b of the frame panel 110. The first opening 111a may have a size different from a size of the second opening 111b. The first opening 111a may have a larger size than the second opening 111b. The insert portion 111 may be provided such that the first opening 111a and the second opening 111b form a step difference.

The second opening 111b is formed to be smaller than the first opening 111a, and thus in response to the brackets 160, 172, 180, and 190 being coupled to the stud 120 in a state in which the stud 120 is inserted into the insert portion 111, a portion of the frame panel 110 forming the second opening 111b may support the stud 120. Therefore, it is possible to improve the pulling force or torque resistance applied to the frame 100.

In addition, the second opening 111b is formed to be smaller than the first opening 111a, and thus in response to the stud 120 being press-fitted into the insert portion 111, a surface formed on the first side 110a and a surface formed on the second side 110b of the frame panel 110 may be formed to be flat without a protruding portion.

Particularly, because the surface formed on the first side 110a of the frame panel 110 is flat without a protruding portion, the display apparatus 1 according to an embodiment of the disclosure may secure a flat surface to tile the plurality of display modules 30A-30w that are attached to the front surface of the frame 100.

In addition, because the surface formed on the second side 110b of the frame panel 110 is flat without a protruding portion, it is possible to prevent an unnecessary increase in the thickness of the display apparatus 1.

Referring to FIG. 7, the frame panel 110 may include a first metal layer 116 forming the first side 110a, a second metal layer 117 forming the second side 110b, and a resin layer 118 arranged between the first metal layer 116 and the second metal layer 117. According to the configuration, the frame panel 110 may have relatively better flatness, and improved rigidity relative to weight.

A size of a portion of the insert portion 111 formed on the resin layer 118 may be approximately the same as a size of another portion of the insert portion 111 formed in the first metal layer 116. That is, the size of one portion of the insert portion 111 formed in the resin layer 118 may be greater than the size of still another portion of the insert portion 111 formed in the second metal layer 117.

The first opening 111a may be formed in the first metal layer 116, and the second opening 111b may be formed in the second metal layer 117.

Referring to FIG. 7, the stud 120 may be inserted into the insert portion 111 through the first opening 111a. The stud 120 may include a coupling portion 120a opened toward the second opening 111b. A screw thread 121 may be formed on an inner circumferential surface of the coupling portion 120a. The coupling portion 120a may be opened toward the first opening 111a. The stud 120 may be supported by a portion of the frame panel 110 forming the second opening 111b.

The frame 100 may include a plurality of module openings 101 formed to correspond to the plurality of display modules 30A-30w.

The brackets 160, 172, 180, and 190 may be detachably mounted on the rear surface of the frame panel 110. The brackets 160, 172, 180, and 190 may be detachably coupled to the stud 120. The brackets 160, 172, 180, and 190 may include at least one of a board bracket 160, a chassis bracket 172, a mounting bracket 180, and a reinforcing bracket 190.

Referring to FIGS. 5 and 6, a circuit board (not shown) configured to drive the display apparatus 1 may be mounted on the board bracket 160. The board bracket 160 may be provided in plurality. The board bracket 160 may include a board bracket hole 161. The board bracket hole 161 may be formed to correspond to the second opening 111b of the frame panel 110. As a fastening member (not shown) passes through the board bracket hole 161 and is coupled to the screw thread 121 of the stud 120, the board bracket 160 may be fixed to the frame 100.

Referring to FIGS. 5 and 8, the chassis bracket 172 may be provided to fix a front chassis 171 provided to cover the edge of the frame 100 to the frame 100. The chassis bracket 172 may be provided in plurality. The chassis bracket 172 may include a chassis bracket hole 173. The chassis bracket hole 173 may be formed to correspond to the second opening 111b of the frame panel 110. As a fastening member (not shown) passes through the chassis bracket hole 173 and is coupled to the screw thread 121 of the stud 120, the chassis bracket 172 may be fixed to the frame 100. The front chassis 171 may be fixed to the chassis bracket 172 fixed to the frame 100.

Referring to FIGS. 5 and 9, the mounting bracket 180 may be provided to be coupled to a wall mount (not shown) in response to the display apparatus 1 being fixed to a wall. The mounting bracket 180 may include a mounting bracket hole 181. The mounting bracket hole 181 may be formed to correspond to the second opening 111b of the frame panel 110. As a fastening member (not shown) passes through the mounting bracket hole 181 and is coupled to the screw thread 121 of the stud 120, the mounting bracket 180 may be fixed to the frame 100.

Referring to FIGS. 5 and 10, the reinforcing bracket 190 may be provided to increase the strength of the frame 100. The reinforcing bracket 190 may extend in an approximately horizontal direction. The reinforcing bracket 190 may include a reinforcing bracket hole 191. The reinforcing bracket hole 191 may be formed to correspond to the second opening 111b of the frame panel 110. As a fastening member (not shown) passes through the reinforcing bracket hole 191 and is coupled to the screw thread 121 of the stud 120, the reinforcing bracket 190 may be fixed to the frame 100.

Although not shown, the display apparatus 1 may include a stand. An insert portion 111, into which a stud 120 for a bracket to which the stand is coupled may be inserted, may be formed in the frame 100.

The frame 100 may include a reinforcing member 130 attached to the first side 110a of the frame panel 110. The reinforcing member 130 may be provided to cover the first opening 111a. The plurality of display modules 30A-30w may be installed on the reinforcing member 130. The reinforcing member 130 may include carbon fiber reinforced plastics (CFRP).

Figure 11:
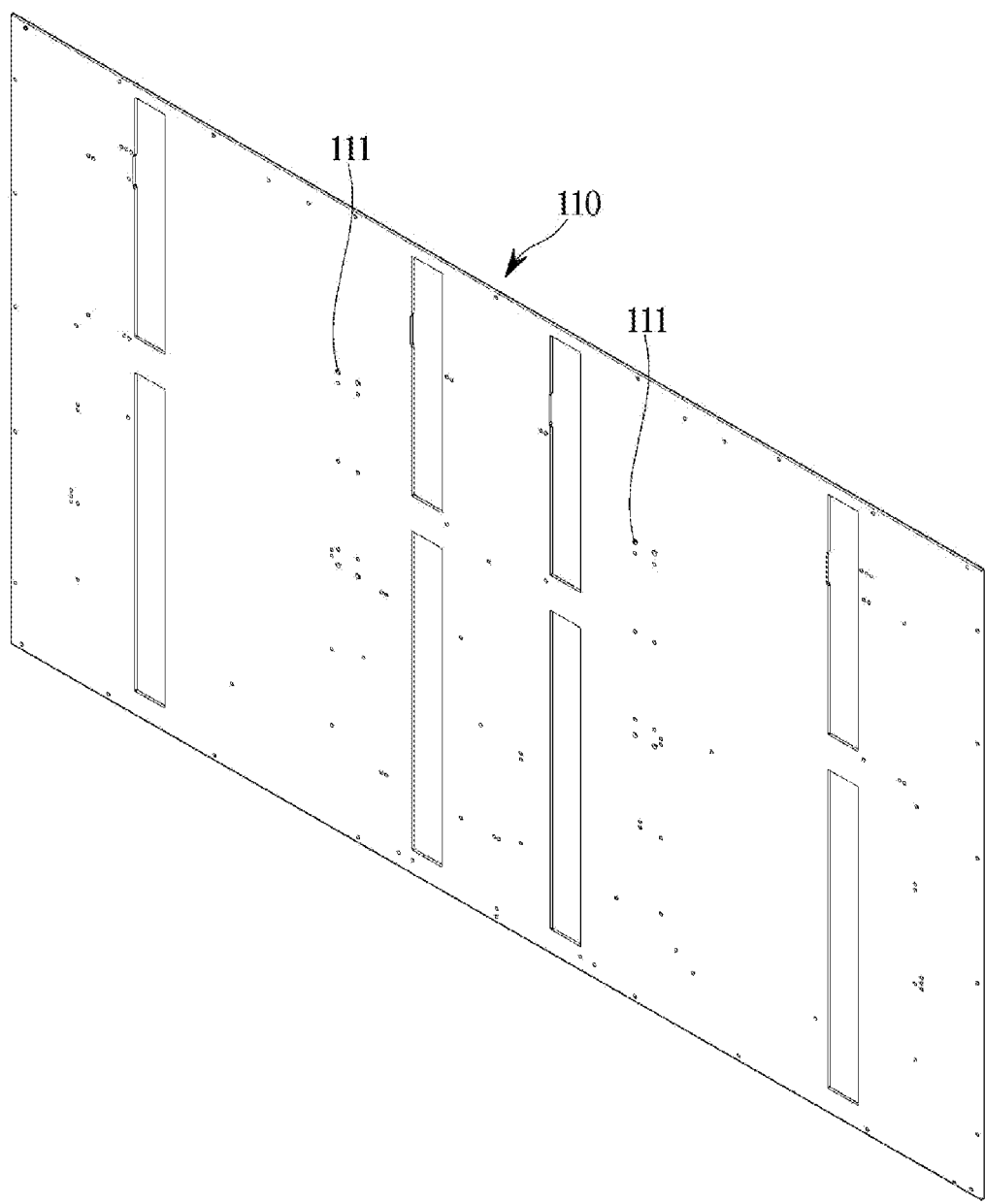
FIG. 11 is a view illustrating a state in which the frame panel shown in FIG. 5 is provided.
Figure 12:
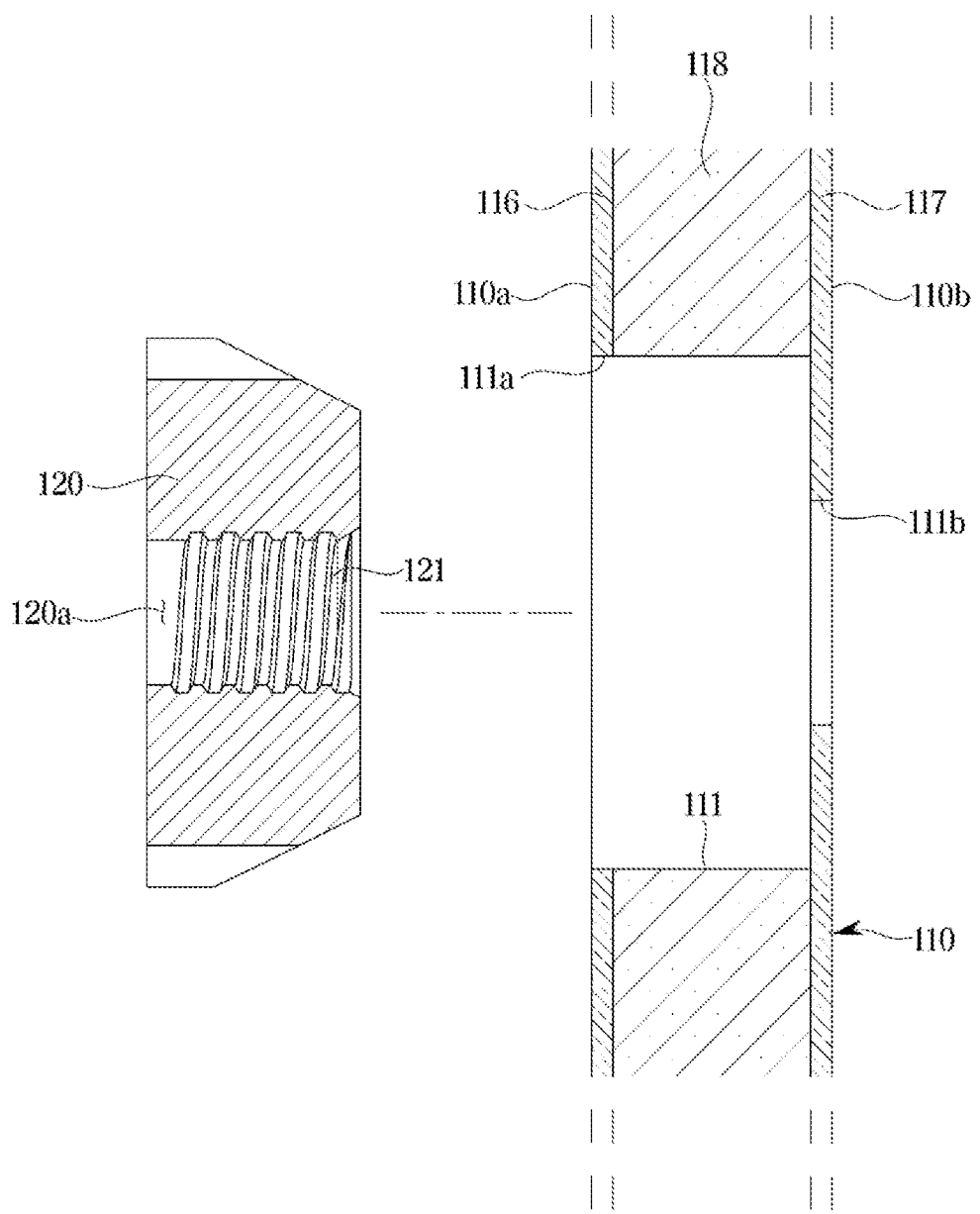
FIG. 12 is a view illustrating a state in which a stud is inserted into an insert portion of the frame panel shown in FIG. 11.
Figure 13:
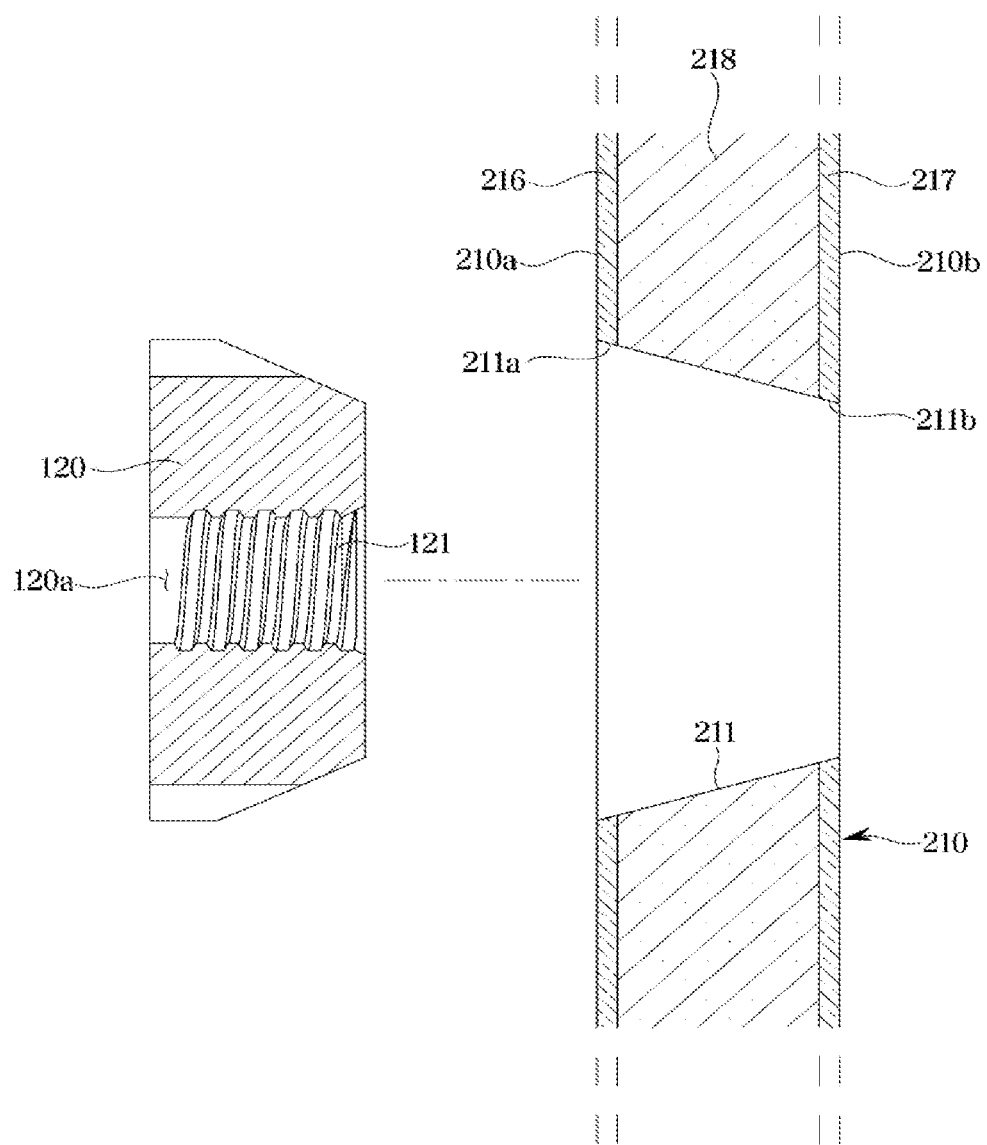
FIG. 13 is a view illustrating another embodiment of the insert portion of the frame panel shown in FIG. 12.
Figure 14:
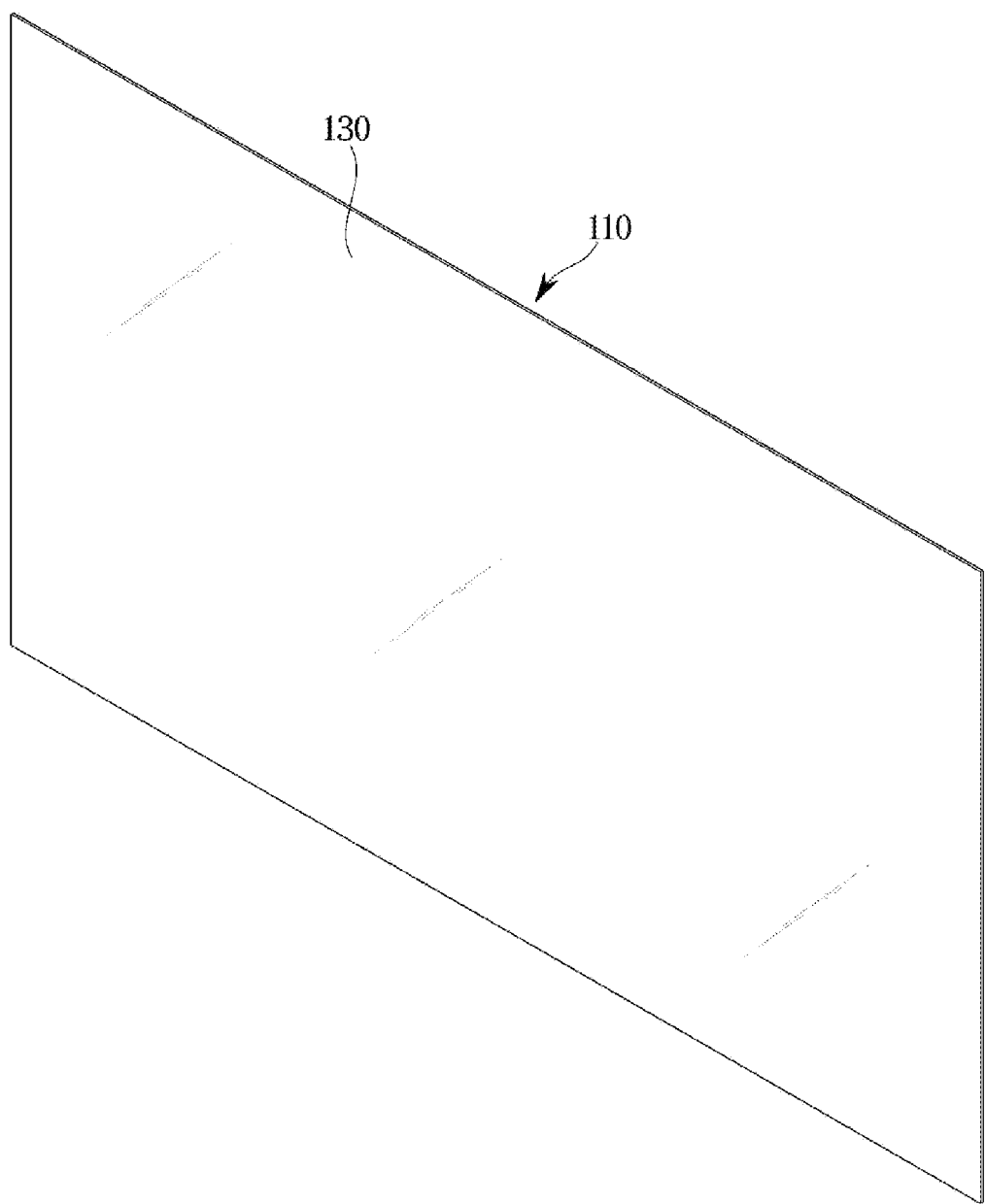
FIG. 14 is a view illustrating a state in which a reinforcing member is attached to the frame panel shown in FIG. 12.
Figure 15:
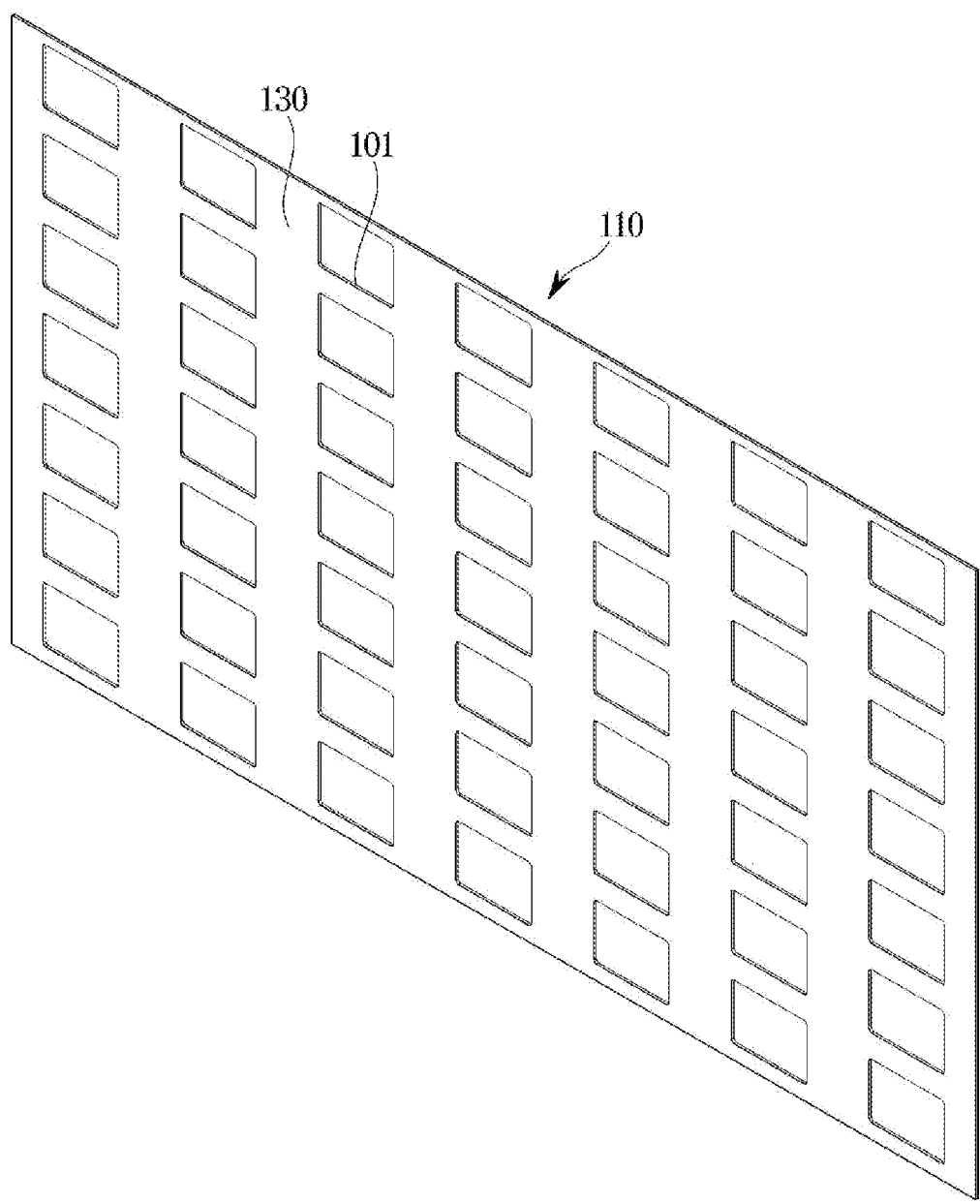
FIG. 15 is a view illustrating a state in which module openings are formed in the frame shown in FIG. 14.
Figure 16:
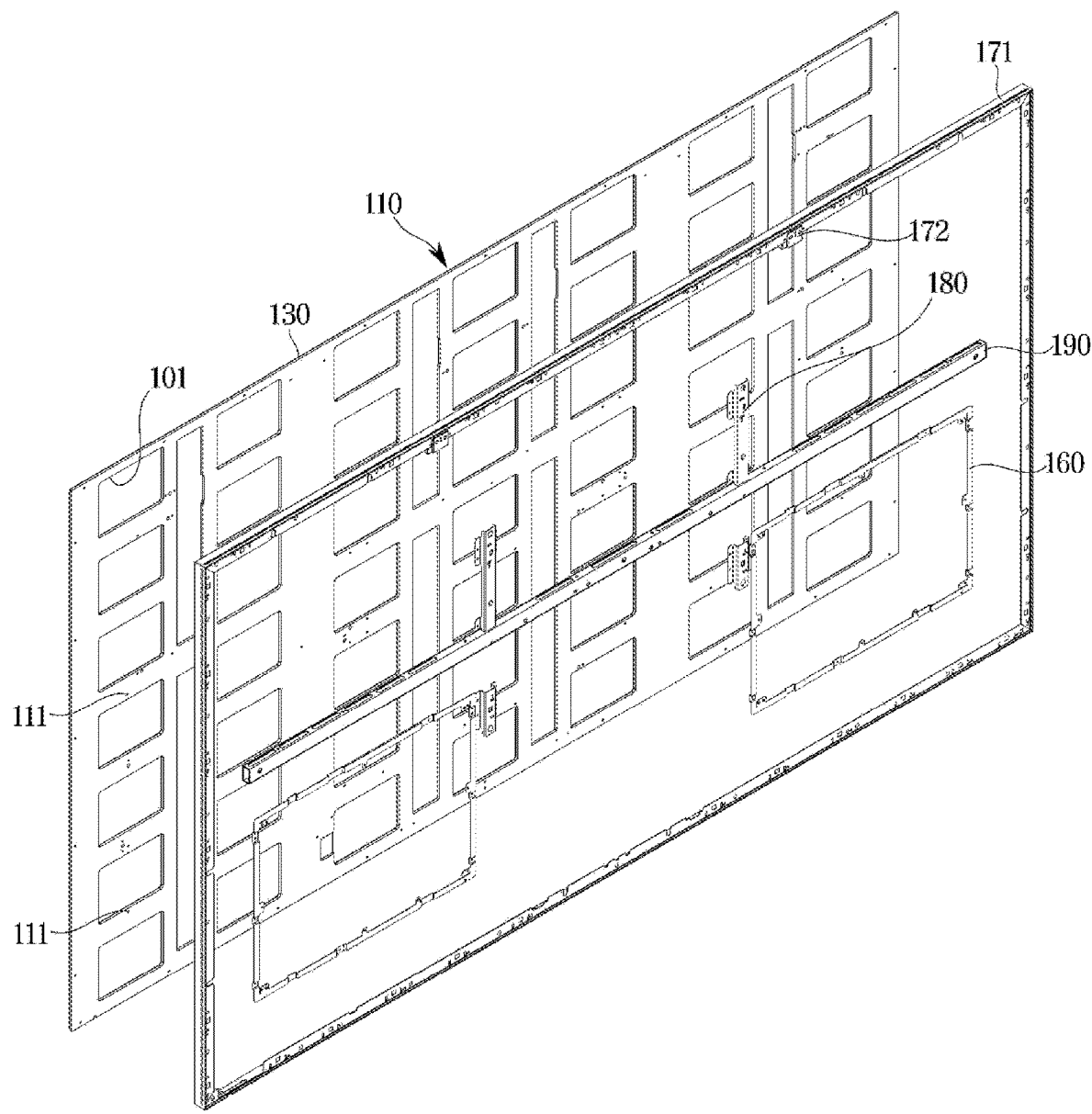
FIG. 16 is a view illustrating a state in which the brackets are mounted to the frame shown in FIG. 15.

FIG. 11 is a view illustrating a state in which the frame panel shown in FIG. 5 is provided. FIG. 12 is a view illustrating a state in which a stud is inserted into an insert portion of the frame panel shown in FIG. 11. FIG. 13 is a view illustrating another embodiment of the insert portion of the frame panel shown in FIG. 12. FIG. 14 is a view illustrating a state in which a reinforcing member is attached to the frame panel shown in FIG. 12. FIG. 15 is a view illustrating a state in which module openings are formed in the frame shown in FIG. 14. FIG. 16 is a view illustrating a state in which the brackets are mounted to the frame shown in FIG. 15.

A process of manufacturing the display apparatus 1 according to an embodiment of the disclosure will be described with reference to FIGS. 11 to 16.

Referring to FIG. 11, the frame panel 110 including the first metal layer 116, the second metal layer 117, and the resin layer 118 may be provided. The insert portion 111 may be formed in the frame panel 110. The insert portion 111 may be formed in the first side 110a of the frame panel 110. The insert portion 111 may be formed to pass through the second side 110b from the first side 110a of the frame panel 110. The insert portion 111 may be formed at various positions according to the type of brackets 160, 172, 180, and 190 to be mounted on the frame 100.

The insert portion 111 may be formed in various ways. The insert portion 111 may be formed on the first side 110a of the frame panel 110 by using at least one of a shape processing apparatus, a water jet, and a laser.

The insert portion 111 may be formed by a shape processing apparatus (not shown). The shape processing apparatus may include a router. Based on the insert portion 111 being formed by the shape processing apparatus, the insert portion 111 may be formed to have a shape in which a step difference is formed between the first opening 111a and the second opening 111b, as shown in FIG. 12.

Alternatively, an insert portion 211 may be formed by a water jet and/or a laser. Based on the insert portion 211 being formed by the water jet and/or the laser, an insert portion 211 may be formed to have a shape that tapers from the first opening 211a to the second opening 211b, as shown in FIG. 13. The insert portion 211 may be formed to decrease in size from the first metal layer 116 to the second metal layer 117.

Referring to FIG. 12, the stud 120 may be inserted into the frame panel 110 on which the insert portion 111 is formed. The stud 120 may be press-fitted from the first side 110a. The stud 120 may be inserted into the insert portion 111 in a direction that is toward the second opening 111b through the first opening 111a. Accordingly, in response to the stud 120 being inserted into the insert portion 111, the stud 120 may be supported by a portion of the frame panel 110 in which the portion of the frame panel 110 forms the second opening 111b.

Referring to FIG. 14, after the stud 120 is inserted into the insert portion 111 of the frame panel 110, the reinforcing member 130 may be attached to the first side 110a of the frame panel 110. Accordingly, the first opening 111a of the insert portion 111 may be covered by the reinforcing member 130.

Referring to FIG. 15, after attaching the reinforcing member 130 to the frame panel 110, the module openings 101 may be formed in the frame panel 110 and the reinforcing member 130. Because the module openings 101 are formed after attaching the reinforcing member 130 to the frame panel 110, it is possible to simplify a manufacturing process.

Referring to FIG. 16, the brackets 160, 172, 180, and 190 may be mounted on the frame 100 in which the module openings 101 are formed. Particularly, the board bracket 160 may be mounted to the frame 100 as being coupled to a first stud at the second side 110b of the frame panel 110. The chassis bracket 172 may be mounted to the frame 100 as being coupled to a second stud at the second side 110b of the frame panel 110. The mounting bracket 180 may be mounted to the frame 100 as being coupled to a third stud at the second side 110b of the frame panel 110. The reinforcing bracket 190 may be mounted to the frame 100 as being coupled to a fourth stud at the second side 110b of the frame panel 110. The brackets 160, 172, 180, and 190 may be detachably coupled to the first to fourth studs through the second openings 111b of the frame panel 110. Each of the first to fourth studs has a shape corresponding to the shape of the stud 120.

After mounting the brackets 160, 172, 180, and 190 on the frame 100, the plurality of display modules 30A-30w may be installed on the front surface of the frame 100.

As is apparent from the above description, a display apparatus and a manufacturing method thereof may improve a pulling force or a torque resistance of a frame provided to support a plurality of display modules, by forming an insert portion of the frame, which is for inserting a stud to which a bracket is detachably coupled, in such a way that a size of a first opening formed on a first side is different from a size of a second opening formed on a second side.

According to various embodiments, the display apparatus is capable of improving a pulling force or a torque resistance of a frame provided to support a plurality of display modules.

According to various embodiments, the display apparatus may secure a flat surface to tile the plurality of display modules attached to a front surface of the frame because a surface formed on a first side of a frame panel is flat without a protruding portion.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:
1. A display apparatus comprising:
a plurality of display modules; and
a frame provided to support the plurality of display modules, the plurality of display modules being arranged in an M*N matrix on the frame,
wherein the frame comprises a frame panel comprising a first side and a second side opposite to the first side, and
wherein the frame panel comprises:
an insert portion passing through the frame panel and having a first opening formed on the first side and a second opening formed on the second side, and a size of the first opening being greater than a size of the second opening; and
a stud provided in the insert portion,
wherein the insert portion is formed in a shape that tapers from the first side toward the second side.
2. The display apparatus of claim 1, wherein the stud comprises a coupling portion having an opening toward the second opening, and
wherein the coupling portion comprises a screw thread formed on an inner circumferential surface of the coupling portion.
3. The display apparatus of claim 1, further comprising:
a bracket detachably coupled to the stud through the second opening,
wherein the bracket comprises at least one of a mounting bracket, a chassis bracket, a reinforcing bracket, and a board bracket.
4. The display apparatus of claim 1, wherein the frame further comprises a reinforcing member attached to the first side of the frame panel and provided to cover the first opening.
5. The display apparatus of claim 4, wherein the plurality of display modules are attached to the reinforcing member.
6. The display apparatus of claim 1, wherein the frame panel further comprises:
a first metal layer forming the first side of the frame panel;
a second metal layer forming the second side of the frame panel; and
a resin layer arranged between the first metal layer and the second metal layer.
7. The display apparatus of claim 6, wherein a size of a portion of the insert portion formed in the resin layer is a same as a size of another portion of the insert portion formed in the first metal layer.
8. The display apparatus of claim 1, wherein each of a surface formed on the first side of the frame panel and a surface formed on the second side of the frame panel is flat.
9. A manufacturing method of a display apparatus, the method comprising:
providing a frame panel including a first side and a second side opposite to the first side;
forming an insert portion to pass through the frame panel and having a first opening formed on the first side and a second opening formed on the second side, and a size of the first opening being greater than a size of the second opening;
inserting a stud into the insert portion through the first opening; and
detachably coupling a bracket to the stud through the second opening, wherein the forming of the insert portion comprises forming the insert portion in a shape that tapers from the first side toward the second side.

10. The manufacturing method of claim 9, wherein the stud includes a coupling portion having an opening toward the second opening, and the coupling portion includes a screw thread formed on an inner circumferential surface of the coupling portion.

11. The manufacturing method of claim 9, further comprising:
attaching a reinforcing member to the first side of the frame panel after inserting the stud into the insert portion.

12. The manufacturing method of claim 11, further comprising:
forming a module opening on the frame panel and the reinforcing member after attaching the reinforcing member to the first side of the frame panel.

13. The manufacturing method of claim 12, further comprising:
attaching a plurality of display modules to the reinforcing member after forming the module opening.

14. The manufacturing method of claim 9, wherein the bracket includes at least one of a mounting bracket, a chassis bracket, a reinforcing bracket, and a board bracket.

15. The manufacturing method of claim 14, wherein the forming of the insert portion comprises forming the insert portion from the first side by using at least one of a shape processing apparatus, a water jet, and a laser.

16. The manufacturing method of claim 9, wherein each of a surface formed on the first side of the frame panel and a surface formed on the second side of the frame panel is flat.

\* \* \* \* \*